United States Patent
Takano et al.

(10) Patent No.: US 8,810,007 B2
(45) Date of Patent: Aug. 19, 2014

(54) WIRING BOARD, SEMICONDUCTOR DEVICE, AND METHOD FOR MANUFACTURING WIRING BOARD

(75) Inventors: Akihito Takano, Nagano-ken (JP);
Masahiro Sunohara, Grenoble (FR);
Hideaki Sakaguchi, Nagano-ken (JP);
Mitsutoshi Higashi, Nagano-ken (JP);
Kenichi Ota, Taito-ku (JP); Yuichi Sasajima, Tokyo (JP)

(73) Assignees: Shinko Electric Industries Co., Ltd., Nagano-ken (JP); Taiyo Yuden Co., Ltd., Tokyo (JP)

(*) Notice: Subject to any disclaimer, the term of this patent is extended or adjusted under 35 U.S.C. 154(b) by 29 days.

(21) Appl. No.: 13/449,034

(22) Filed: Apr. 17, 2012

(65) Prior Publication Data
US 2012/0261832 A1    Oct. 18, 2012

(30) Foreign Application Priority Data

Apr. 18, 2011  (JP) .................... 2011-092202

(51) Int. Cl.
| | |
|---|---|
| *H01L 29/40* | (2006.01) |
| *H01L 23/498* | (2006.01) |
| *H01L 23/50* | (2006.01) |
| *H05K 1/03* | (2006.01) |
| *H05K 1/16* | (2006.01) |

(52) U.S. Cl.
CPC . *H01L 23/49822* (2013.01); *H01L 2924/01322* (2013.01); *H01L 23/50* (2013.01); *H01L 23/49827* (2013.01); *H05K 1/0306* (2013.01); *H01L 2224/16225* (2013.01); *H05K 1/162* (2013.01)
USPC .......... 257/621; 257/532; 257/516; 257/535; 257/773; 257/774; 257/758; 257/E21.008; 257/E23.079; 257/E23.011; 257/E23.067; 438/667; 438/106; 438/386; 438/387; 438/388; 174/260

(58) Field of Classification Search
USPC ................. 257/532, 774, 758, 773, E21.008, 257/E23.079, E23.067, 516, 535, 621, 257/E23.011; 438/106, 386, 387, 388, 667; 174/260
See application file for complete search history.

(56) References Cited

U.S. PATENT DOCUMENTS

| | | | | |
|---|---|---|---|---|
| 6,498,714 | B1 * | 12/2002 | Fujisawa et al. ........... | 361/306.3 |
| 6,565,730 | B2 * | 5/2003 | Chakravorty et al. ........ | 205/122 |
| 6,678,144 | B2 * | 1/2004 | Higashi et al. ............. | 361/306.3 |
| 6,963,483 | B2 * | 11/2005 | Chakravorty et al. ..... | 361/306.3 |

(Continued)

FOREIGN PATENT DOCUMENTS

| | | | | |
|---|---|---|---|---|
| EP | 1691414 A2 * | 8/2006 | ............. | H01L 21/48 |
| JP | 2003-133507 | 5/2003 | | |
| JP | 2011071372 A * | 4/2011 | | |

*Primary Examiner* — Marvin Payen
*Assistant Examiner* — Victor Barzykin
(74) *Attorney, Agent, or Firm* — Fish & Richardson P.C.

(57) ABSTRACT

A wiring board provided with a silicon substrate including a through hole that communicates a first surface and a second surface of the silicon substrate. A capacitor is formed on an insulating film, which is applied to the silicon substrate, on the first surface and a wall surface defining the through hole. A capacitor part of the capacitor includes a first electrode, a dielectric layer, and a second electrode that are sequentially deposited on the insulating film on the first surface and the wall surface of the through hole. A penetration electrode is formed in the through hole covered by the first electrode, the dielectric layer, and the second electrode of the capacitor part.

12 Claims, 15 Drawing Sheets

(56) References Cited

U.S. PATENT DOCUMENTS

| | | | |
|---|---|---|---|
| 7,508,079 B2* | 3/2009 | Higashi | 257/774 |
| 7,589,394 B2* | 9/2009 | Kawano | 257/532 |
| 7,603,772 B2* | 10/2009 | Farnworth et al. | 29/852 |
| 7,894,178 B2* | 2/2011 | Wu et al. | 361/528 |
| 7,906,404 B2* | 3/2011 | DeNatale et al. | 438/386 |
| 7,995,352 B2* | 8/2011 | Inagaki et al. | 361/763 |
| 8,088,667 B2* | 1/2012 | DeNatale et al. | 438/386 |
| 2005/0146049 A1* | 7/2005 | Kripesh et al. | 257/776 |
| 2008/0253097 A1* | 10/2008 | Kawano | 361/766 |
| 2009/0159322 A1* | 6/2009 | Wu et al. | 174/260 |
| 2010/0001378 A1* | 1/2010 | DeNatale et al. | 257/621 |
| 2010/0127346 A1* | 5/2010 | DeNatale et al. | 257/532 |
| 2012/0261801 A1* | 10/2012 | Takano et al. | 257/621 |

\* cited by examiner

WIRING BOARD, SEMICONDUCTOR DEVICE, AND METHOD FOR MANUFACTURING WIRING BOARD

CROSS-REFERENCE TO RELATED APPLICATIONS

This application is based upon and claims the benefit of priority from prior Japanese Patent Application No. 2011-092202, filed on Apr. 18, 2011, the entire contents of which are incorporated herein by reference.

BACKGROUND

The present invention relates to a wiring board, a semiconductor device, and a method for manufacturing a wiring board.

A known interposer is used to electrically connect a semiconductor element to a mounting board such as a mother board. An interposer includes a silicon substrate, which has through holes, and a penetration electrode, which is insulated from the silicon substrate.

A typical method for fabricating the penetration electrode will now be described.

As illustrated in FIG. 15A, a silicon substrate 110 is prepared. As illustrated in FIG. 15B, through holes 110X for arranging penetration electrodes on the silicon substrate 110 are fabricated. As illustrated in FIG. 15C, by thermally oxidizing the silicon substrate 110, an insulating film 111 is formed on the outer surfaces of the silicon substrate 110 and wall surfaces of the through holes 110X. As illustrated in FIG. 15D, penetration electrode 112 are fabricated by filling a conductive material in the through holes 110X by electrolytic plating or the like.

In a semiconductor package having fine and highly dense wiring, patterned wires are close to each other. This causes problems such as crosstalk noise between wires or variations in the potential at power lines or the like. Thus, in order to stabilize power voltage and reduce switching noise, a technique of embedding a capacitor (decoupling capacitor) in a wiring board has been proposed (refer to, for example, Japanese Patent No. 3967108). For example, electronic devices such as recent portable terminals that have become compact and thin include thin-film capacitors embedded in wiring boards. Such a thin-film capacitor embedded in a wiring board includes a dielectric layer, which is formed from a high dielectric constant material, and upper and lower electrodes that sandwich the dielectric layer.

Here, one example of a method for embedding and mounting a thin-film capacitor on a wiring board including the penetration electrodes 112 will now be described.

As illustrated in FIG. 15E, a layer 113A that becomes a lower electrode, a layer 114A that becomes a dielectric layer, and a layer 115A that becomes an upper electrode are sequentially deposited on upper surfaces of the insulating film 111, which cover an upper surface of the silicon substrate 110, and the penetration electrodes 112. As illustrated in FIG. 15F, the layers 115A, 114A and 113A are sequentially patterned to predetermined shapes to form an upper electrode 115, a dielectric layer 114, and a lower electrode 113, respectively. This forms the lower electrode 113 and the upper electrode 115 opposed to each other at opposite sides of the dielectric layer 114. As illustrated in FIG. 15G, insulating layers and wires are formed so that the lower electrode 113 and the upper electrode 115 are electrically connected to different pads P1 and P2 formed in an outermost wiring layer. The pads P1 and P2 are used as a power terminal or a ground terminal.

This manufactures the wiring board including the thin-film capacitor formed by sequentially depositing the lower electrode 113, the dielectric layer 114, and the upper electrode 115.

SUMMARY OF THE INVENTION

Nowadays, thin film capacitors are required to have increased capacitance. To increase the capacitance of a thin-film capacitor, the opposing surfaces of the electrodes 113 and 115 sandwiching the dielectric layer 114 may have a larger area, the thickness of the dielectric layer 114 may be decreased, or the relative permittivity of the dielectric layer 114 may be further increased. However, a decrease in the thickness of the dielectric layer 114 would lower the rated voltage or breakdown voltage and is not practical. An increase in the relative permittivity of the dielectric layer is limited by the material and is not practical. Further, enlargement of the area of the opposing surfaces of the electrodes 113 and 115 obstructs with miniaturization of the wiring board when reducing the size of an electronic device and is not practical. More specifically, reduction in the size of electronic devices results in miniaturization of wiring boards. Thus, it becomes difficult to ensure a capacitance formation region (opposing area of the electrodes 113 and 115) that obtains a large capacitance in such wiring board. Accordingly, a thin-film capacitor having the desired capacitance cannot easily be embedded in a wiring board.

One aspect of the present invention is a wiring board provided with a silicon substrate including a through hole that communicates a first surface and a second surface of the silicon substrate. A capacitor is formed on an insulating film, which is applied to the silicon substrate, on the first surface and a wall surface defining the through hole. A capacitor part of the capacitor includes a first electrode, a dielectric layer, and a second electrode that are sequentially deposited on the insulating film on the first surface and the wall surface of the through hole. A penetration electrode is formed in the through hole covered by the first electrode, the dielectric layer, and the second electrode of the capacitor part.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

Figure 1:
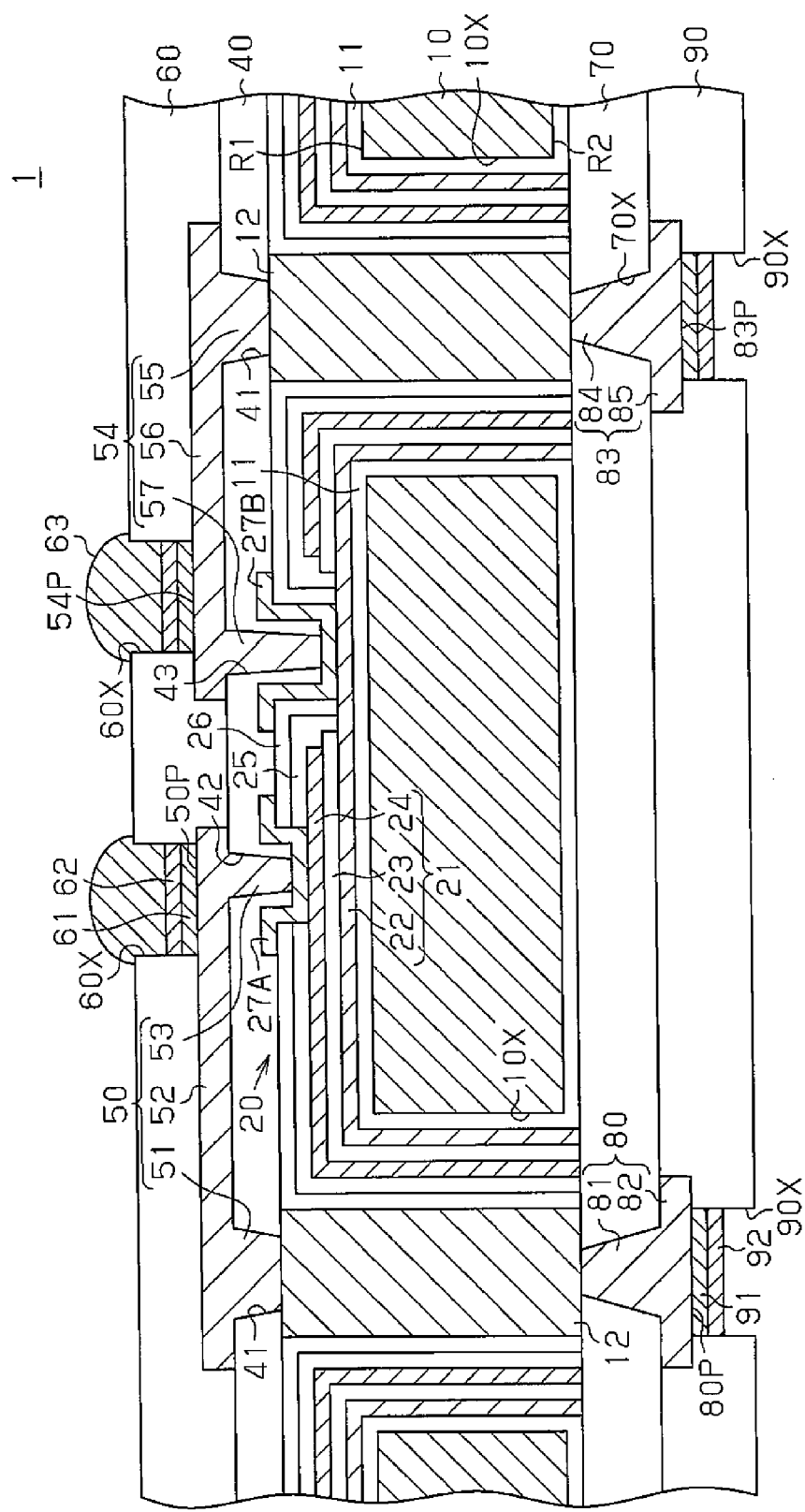
FIG. 1 is a schematic cross-sectional view illustrating part of a wiring board in a first embodiment.

Embodiments of the present invention will now be described with reference to the drawings. The drawings schematically illustrate structures and are not in actual scale. To facilitate understanding of the cross-sectional structure of each member, in cross-sectional views, hatching lines are not added to insulating layers.

First Embodiment

A first embodiment will now be described with reference to FIGS. 1 to 8.

First, the structure of a wiring board 1 will be described.

The wiring board 1 includes a substrate 10, penetration electrodes 12, which extend through the substrate 10 between a first surface R1 and a second surface R2, and a thin-film capacitor 20. In this manner, the wiring board 1 is a capacitor-embedded substrate in which the thin-film capacitor 20 is embedded.

The substrate 10 is a tetragonal silicon substrate. Through holes 10X extend through the substrate 10 in the thickness direction at desired positions (two positions in FIG. 1) in the substrate 10. An insulating film 11 is formed to cover the two surfaces (the first surface R1 and the second surface R2) of the substrate 10 and wall surfaces of the through holes 10X. For example, a silicon oxide layer or a silicon nitride layer can be used as the insulating film 11.

The capacitor 20 is fabricated on the insulating film 11, which covers the first surface R1 of the substrate 10 and the wall surfaces defining the through holes 10X. The structure of the capacitor 20 will now be described.

A capacitor part 21 is formed by sequentially depositing a first electrode 22, a dielectric layer 23, and a second electrode 24 on the insulating film 11, which covers the first surface R1 of the substrate 10 and the wall surfaces of the through holes 10X. Specifically, the first electrode 22 and the second electrode 24 are deposited at opposite sides of the dielectric layer 23. The dielectric layer 23 is sandwiched between the first electrode 22 and the second electrode 24. In the illustrated example, the first electrode 22 is formed continuously on the insulating film 11, which covers the first surface R1 of the substrate 10 and the wall surfaces of the through holes 10X. The dielectric layer 23 is deposited on generally the entire outer surface of the first electrode 22 (upper surface and wall surface) excluding a part of the first electrode 22. The second electrode 24 is deposited on generally the entire surface of the dielectric layer 23 excluding a part of the dielectric layer 23. Accordingly, the second electrode 24 includes openings for exposing the part of first electrode 22 and the part of the dielectric layer 23. The first electrode 22, the dielectric layer 23, and the second electrode 24 included in the capacitor part 21 are located at a first surface side of the substrate 10 and inside the inner surfaces (the wall surfaces) of the through holes 10X. Accordingly, the inner surfaces of the through holes 10X provide surfaces for forming the capacitor 20. In the specification, the phrase of "located at a first surface side of the substrate 10" refers to "located on or above the first surface R1 of the substrate 10." Similarly, a phrase of "located at a second surface side of the substrate 10" may refer to "located on or below the second surface R2 of the substrate 10."

For example, noble metals, such as platinum (Pt), iridium (Ir), and ruthenium (Ru), and conductive oxides, such as $LaNiO_3$, $SrRuO_3$ and $IrO_2$, can be used as the material for the first electrode 22 and the second electrode 24. Preferably, the thickness of each of the first electrode 22 and the second electrode 24 is, for example, 100 to 500 nm and is 250 nm in the first embodiment.

For example, barium titanate ($BaTiO_3$: BT), barium strontium titanate ($BaSrTiO_3$: BST), lead zirconate titanate (Pb(Zr, Ti)$O_3$: PZT), and other Perovskite oxides can be used as the material for the dielectric layer 23. Preferably, the thickness of the dielectric layer 23 is, for example, 50 nm to 500 nm and is 150 nm in the first embodiment.

A first insulating layer 25 is formed on the capacitor part 21 to cover the entire capacitor part 21 except for part of the first electrode 22 and part of the second electrode 24. As will be described below with reference to FIGS. 4D and 6B, the first insulating layer 25 includes an opening 25X exposing part of an upper surface of the second electrode 24 and an opening 25Y exposing part of an upper surface of the first electrode 22. The first insulating layer 25 functions to improve adhesiveness between the capacitor part 21 and a second insulating layer 26, which will be described later. The first insulating layer 25 also functions as a hydrogen barrier layer that prevents hydrogen from diffusing into the capacitor part 21. For example, $TiOx$, $Al_2O_3$, $Ta_2O_5$, SiN, $SrTiO_3$ can be used as materials for the first insulating layer 25 that performs these functions. A monolayer of one of the above materials or a multilayer formed by depositing one or more of the above materials may be used as the first insulating layer 25. Preferably, the thickness of the first insulating layer 25 is, for example, 50 nm to 3000 nm and is 300 nm in the first embodiment.

The second insulating layer 26 is formed on the first insulating layer 25 to cover the first insulating layer 25. That is, the second insulating layer 26 is formed to cover the entire capacitor part 21 except for part of the first electrode 22 and part of the second electrode 24. The second insulating layer 26 protects the capacitor part 21, which includes the first electrode 22, the dielectric layer 23, and the second electrode 24. As will be described below with reference to FIGS. 5A and 6B, the second insulating layer 26 has an opening 26X exposing part of the upper surface of the second electrode 24 and an opening 26Y exposing part of the upper surface of the first electrode 22. An inorganic insulating film of $SiO_2$, SiN, or the like and an organic insulating film of polyimide resin or the like can be used as the second insulating layer 26. Preferably, the thickness of the second insulating layer 26 is, for example, 500 nm to 5000 nm and is 500 nm in the first embodiment.

A first conductive layer 27A is formed to cover the second electrode 24 exposed from the openings 25X and 26X of the first insulating layer 25 and the second insulating layer 26. That is, the first conductive layer 27A is formed to cover the portion of the second electrode 24, which is not covered by the insulating layers 25 and 26. The first conductive layer 27A is electrically connected to the second electrode 24. The first conductive layer 27A is functioned as a hydrogen barrier layer that prevents hydrogen from diffusing into the capacitor part 21 (for example, the second electrode 24). A second conductive layer 27B is formed to cover the first electrode 22 exposed from the openings 25Y and 26Y of the first insulating layer 25 and the second insulating layer 26. That is, the second conductive layer 27B is formed to cover the portion of the first electrode 22, which is not covered by the insulating layers 25 and 26. The second conductive layer 27B is electrically connected to the first electrode 22. The second conductive layer 27B is functioned as a hydrogen barrier layer that prevents hydrogen from diffusing into the capacitor part 21 (for example, the first electrode 22). For example, TiN, TaN, TiSiN, TaSiN, other nitrides, SrRuO$_3$, IrO$_3$, other oxides or a deposited film of these substances can be used as the materials for the first conductive layer 27A and the second conductive layer 27B. For example, a deposited film including a TaN layer and a Ta metal layer can be used as the deposited film. Preferably, the thickness of each of the conductive layers 27A and 27B is, for example, 10 nm to 100 nm and is 100 nm in the first embodiment.

As described above, the first insulating layer 25 and the second insulating layer 26 included in the capacitor 20 are located at the first surface side of the substrate 10 and inside the wall surfaces of the through holes 10X.

The penetration electrodes 12 fill the through holes 10X, each covered by the multilayer structure in which the insulating film 11, the first electrode 22, the dielectric layer 23, the second electrode 24, the first insulating layer 25, and the second insulating layer 26 are sequentially deposited. The multilayer structure between the penetration electrodes 12 and the insulating film 11, which covers the wall surfaces of the through holes 10X, are also included in the capacitor 20.

The upper surface of the each penetration electrode 12 is generally flush with the upper surface of the second insulating layer 26. The lower surface of each penetration electrode 12 is generally flush with the first electrode 22, the dielectric layer 23, the second electrode 24, and the insulating film 11, which covers the second surface R2 of the substrate 10 and the through holes 10X. For example, copper (Cu) and Cu alloy can be used as materials for the penetration electrode 12.

An insulating layer 40 is formed in the first surface side of the substrate 10 to cover part of the penetration electrodes 12 and part of the capacitor 20. The insulating layer 40 includes a via hole 41 exposing part of the upper surface of each electrode 12, a via hole 42 exposing part of an upper surface of the first conductive layer 27A, and a via hole 43 exposing part of an upper surface of the second conductive layer 27B. For example, insulating resin such as epoxy resin and polyimide resin can be used as the material for the insulating layer 40.

Wiring layers 50 and 54 having predetermined patterns are formed on the insulating layer 40. The wiring layer 50 includes a via 51 formed in a via hole 41 of the insulating layer 40, a wiring pattern 52 formed on the insulating layer 40, and a via 53 formed in the via hole 42 of the insulating layer 40. The via 51 is electrically connected to the upper surface of the corresponding penetration electrode 12. The via 53 is electrically connected to the upper surface of the first conductive layer 27A. The wiring pattern 52 is electrically connected between the via 51 and the via 53. Thus, the second electrode 24 of the capacitor 20 is electrically connected to the penetration electrode 12 via the first conductive layer 27A and the wiring layer 50 (a wiring pattern electrically connected to the second electrode of the capacitor 20).

The wiring layer 54 includes a via 55 formed in a via hole 41 of the insulating layer 40, a wiring pattern 56 formed on the insulating layer 40, and a via 57 formed in the via hole 43 of the insulating layer 40. The via 55 is electrically connected to the upper surface of the penetration electrode 12. The via 57 is electrically connected to the upper surface of the second conductive layer 27B. The wiring pattern 56 is electrically connected between the via 55 and the via 57. Thus, the first electrode 22 of the capacitor 20 is electrically connected to the penetration electrode 12 via the second conductive layer 27B and the wiring layer 54 (a wiring pattern electrically connected to the first electrode of the capacitor 20). For example, Cu, nickel (Ni), Cu alloy, and Ni alloy can be used as the materials for the wiring layers 50 and 54.

A solder resist layer 60 is formed on an upper surface of the insulating layer 40 to cover the insulating layer 40 and parts of the wiring layers 50 and 54. The solder resist layer 60 includes openings 60X exposing parts of the wiring pattern 52 and 56 as pads 50P and 54P. For example, insulating resin such as epoxy resin can be used as the material for the solder resist layer 60.

Figure 2:
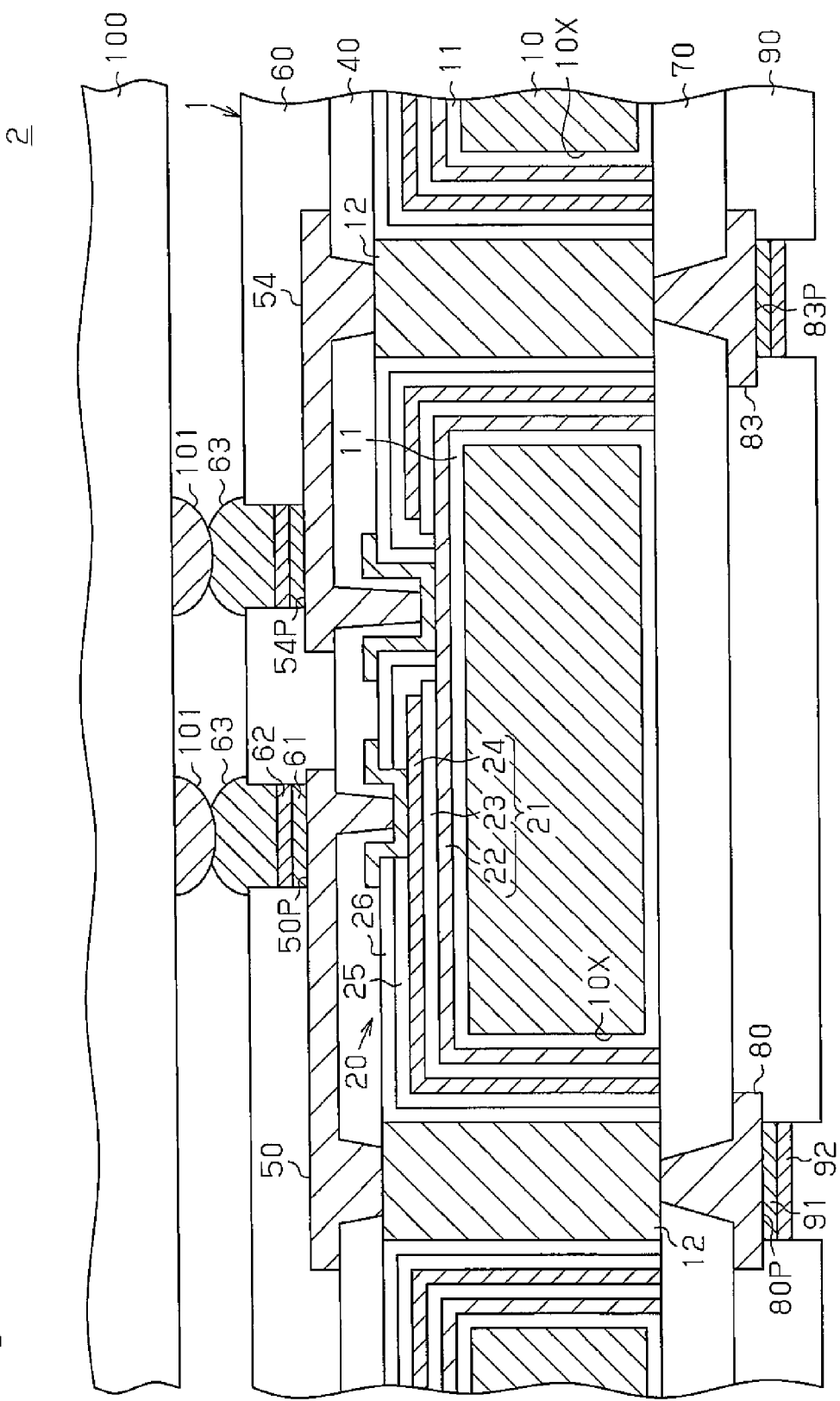
FIG. 2 is a schematic cross-sectional view illustrating part of a semiconductor device in the first embodiment.

As illustrated in FIG. 2, an electrode terminal (bump) 101 of a semiconductor element 100 mounted on the wiring board 1 is bonded to each of the pads 50P and 54P. A first surface plating layer 61 and a second surface plating layer 62 are sequentially formed on each of the pads 50P and 54P. Here, for example, the first surface plating layer 61 is a Ni plating and the second surface plating layer 62 is a gold (Au) plating. The first surface plating layer 61 functions to improve adhesiveness between each of the pads 50P and 54P (the wiring patterns 52 and 56) and the second surface plating layer 62 and functions to prevent metal (for example, Cu) in the pads 50P and 54P from diffusing into the second surface plating layer 62. The second surface plating layer 62 functions to improve contact with the bonded bump 101 (external connection terminal) of the semiconductor element 100.

A solder 63 is connected to each of the pads 50P and 54P to facilitate coupling with the bumps 101 when mounting the semiconductor element 100. For example, eutectic solder and lead (Pb)-free solder (Sn—Ag-based, Sn—Cu-based, Sn—Ag—Cu-based, and so on) can be used as the solder 63.

As illustrated in FIG. 1, an insulating layer 70 is formed on the insulating film 11 on the second surface R2 of the substrate 10. The insulating layer 70 includes via holes 70X exposing parts of the lower surfaces of the penetration electrodes 12. Insulating resin such as epoxy resin and polyimide resin can be used as the material for the insulating layer 70.

Wiring layers 80 and 83 of predetermined pattern are formed on the insulating layer 70. The wiring layer 80 includes a via 81, which is formed in the via hole 70X of the insulating layer 70, and a wiring pattern 82, which is formed on a lower surface of the insulating layer 70. The via 81 is connected to the lower surface of the penetration electrode 12 that is connected to the wiring layer 50 (a wiring pattern electrically connected to the second electrode of the capacitor 20) and thereby electrically connected to the wiring pattern 82. The wiring layer 83 includes a via 84, which is formed in the via hole 70X of the insulating layer 70, and a wiring pattern 85, which is formed on the lower surface of the insulating layer 70. The via 84 is connected to the lower surface of the penetration electrode 12 that is connected to the wiring layer 54 (a wiring pattern electrically connected to the first electrode of the capacitor 20) and thereby electrically connected to the wiring pattern 85. For example, Cu, Ni, Cu alloy and Ni alloy can be used as materials for the wiring layers 80 and 83.

A solder resist layer 90 is formed on the lower surface of the insulating layer 70 to cover the insulating layer 70 and parts of the wiring layers 80 and 83. The solder resist layer 90 includes openings 90X exposing parts of the wiring patterns 82 and 85 as external connecting pads 80P and 83P. Insulating resin such as epoxy resin can be used as the material for the solder resist layer 90.

An external connecting terminal such as a solder ball or a lead pin, which is used to mount the wiring board 1 to a mounting substrate such as a mother board, is bonded to each of the external connecting pads 80P and 83P. A first surface plating layer 91 and a second surface plating layer 92 are sequentially formed on the external connecting pads 80P and 83P in the same manner as the pads 50P and 54P. Here, for example, the first surface plating layer 91 is a Ni plating and the second surface plating layer 92 is an Au plating.

In the wiring board 1 in which the capacitor 20 is embedded (incorporated), the second electrode 24 and the first electrode 22 of the capacitor 20 are electrically connected to the different pads 50P and 54P, which are formed in the outermost wiring layers 50 and 54, and the different external connecting pads 80P and 83P, which are formed in the outermost wiring layers 80 and 83, respectively.

More specifically, the second electrode 24 is connected to the pad 50P (the wiring pattern 52) by the first conductive layer 27A and the via 53. The second electrode 24 is also connected to the external connecting pad 80P (the wiring pattern 82) by the wiring pattern 52, the via 51, the penetration electrode 12, and the via 81. The pads 50P and 80P are used as power terminals, for example.

The first electrode 22 is connected to the pad 54P (the wiring pattern 56) by the second conductive layer 27B and the via 57. Further, the first electrode 22 is also connected to the external connecting pad 83P (the wiring pattern 85) by the wiring pattern 56, the via 55, the penetration electrode 12, and the via 84. The pads 54P and 83P are used as, for example, ground terminals.

The structure of a semiconductor device 2 will now be described.

As illustrated in FIG. 2, the semiconductor device 2 includes the wiring board 1 and the semiconductor element 100, which is mounted on the wiring board 1.

The semiconductor element 100 is flip-chip connected to the wiring board 1. That is, semiconductor element 100 is electrically connected to the solders 63 on the pads 50P and 54P of the wiring board 1 by the bumps 101 arranged on the circuit formation surface (the lower surface in FIG. 2). The semiconductor element 100 is, for example, an IC chip or an LSI chip.

Operations of the wiring board 1 and the semiconductor device 2 will now be described.

In the wiring board 1 of the first embodiment, the capacitor 20 (capacitor part 21) is formed over the first surface R1 of the substrate 10 and the wall surfaces of the through holes 10X. Thus, the areas of the opposing surfaces of the first electrode 22 and the second electrode 24 sandwiching the dielectric layer 23 can be enlarged compared to a comparison example in which a capacitor is formed on only the first surface R1 of the substrate 10. The increase in the area of the opposing surfaces increases the capacitance of the capacitor 20. Further, four types of insulating layers including the insulating film 11, the dielectric layer 23, the first insulating layer 25, and the second insulating layer 26 are formed between the penetration electrodes 12 and the substrate 10. This increases the thickness of the insulating layer between the penetration electrode 12 and the substrate 10 compared to when only the insulating film 11 is present between the penetration electrode 12 and the substrate 10. Accordingly, as compared to when only the insulating film 11 is present between the penetration electrode 12 and the substrate 10, the insulation reliability of the through holes 10X can be improved.

A method for manufacturing the wiring board 1 will now be described.

Figure 3A:
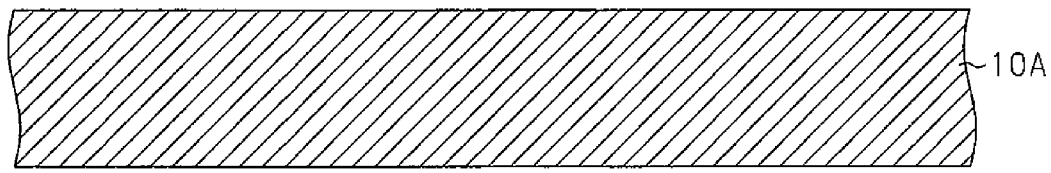
FIGS. 3A to 3D, 4A to 4D, 5A to 5D, 6A to 6D, 7A to 7C, and 8A are schematic cross-sectional views illustrating a method for manufacturing the wiring board in the first embodiment.
Figure 3B:
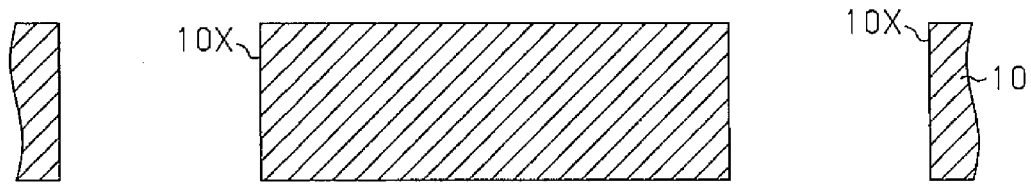

First, as illustrated in FIG. 3A, a silicon substrate 10A, which serves as a base material for the substrate 10, is prepared. The thickness of the silicon substrate 10A is, for example, 600 μm to 800 μm. As illustrated in FIG. 3B, the through holes 10X that extend through the silicon substrate 10A from an upper surface to a lower surface is formed at desired positions (two positions in FIG. 3B) of the silicon substrate 10A to form the substrate 10. The through holes 10X are formed by etching the silicon substrate 10A through openings of a mask (not illustrated) by, for example, deep reactive ion etching.

Figure 3C:
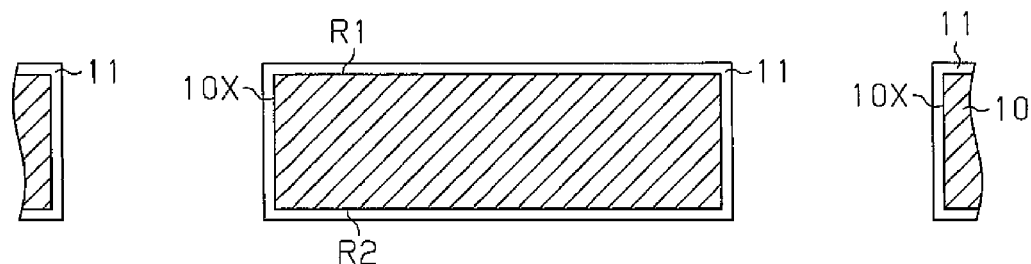

As illustrated in FIG. 3C, the insulating film 11 is formed on the first surface R1 and second surface R2 of the substrate 10 and the wall surfaces of the through holes 10X. The insulating film 11 can be formed, for example, by thermally oxidizing the substrate 10. A silicon oxide layer may be formed on the entire surface of the substrate 10 by chemical vapor deposition (CVD) or the like to form the insulating film 11.

Figure 3D:
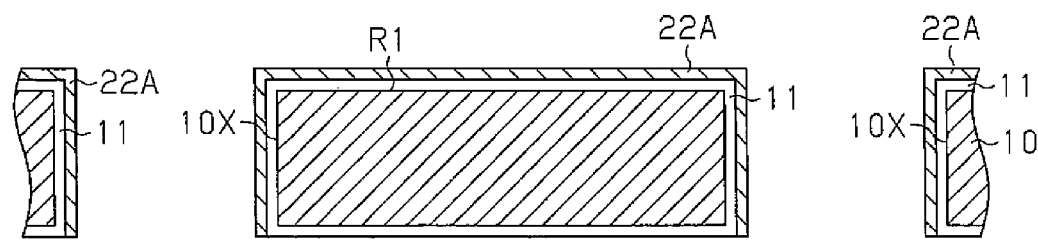

As illustrated in FIG. 3D, a metal layer 22A that becomes the first electrode 22 is formed on the insulating film 11 that is formed on the first surface R1 of the substrate 10 and the wall surfaces of the through holes 10X. The metal layer 22A may be formed by vacuum deposition or sputtering when the material for the metal layer 22A is noble metal such as Pt, Ir, or Ru, and by sputtering, a sol-gel process, or metal organic chemical vapor deposition (MOCVD) when the material for the metal layer 22A is a conductive oxide such as $SrRuO_3$.

Figure 4A:
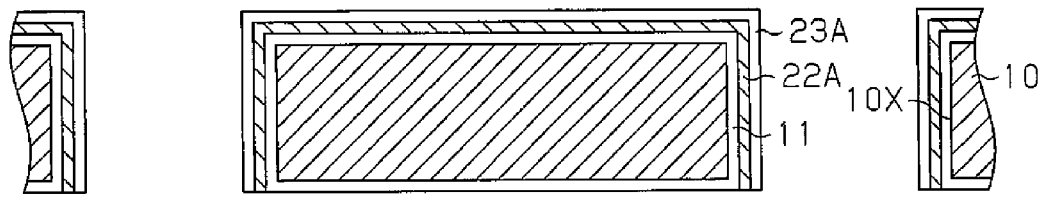

As illustrated in FIG. 4A, a dielectric layer 23A that becomes the dielectric layer 23 is formed on the metal layer 22A. The dielectric layer 23A can be formed by sputtering, a sol-gel process, CVD or the like.

Figure 4B:
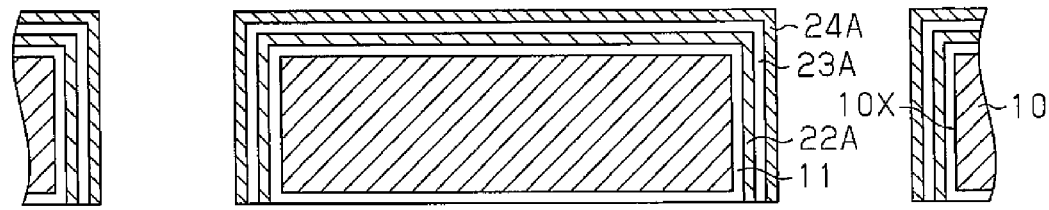

Next, as illustrated in FIG. 4B, a metal layer 24A that becomes the second electrode 24 is formed on the dielectric layer 23A. The metal layer 24A can be formed in the same manner as the metal layer 22A.

A resist film (not illustrated) is formed on the metal layer 24A to form a resist pattern (not illustrated) having a predetermined shape, for example, by photolithography. By dry etching using the resist pattern as an etching mask, the metal layer 24A is patterned to a predetermined shape. After completion of the patterning, the resist pattern is removed by ashing. Then, by repeating the series of such processing including the formation of the resist film, the formation of the resist pattern, dry etching, and ashing, the dielectric layer 23A and the metal layer 22A can be sequentially patterned to the predetermined shape. Such patterning obtains the structure illustrated in FIG. 4C. In the illustrated example, the metal layer 22A is not patterned and directly becomes the first electrode 22. The dielectric layer 23A is patterned and becomes the dielectric layer 23 having an opening 23X that exposes part of the upper surface of the first electrode 22. The metal layer 24A is patterned and becomes the second electrode 24 having an opening 24X that exposes part of the upper surface of the first electrode 22 and part of the upper surface of the dielectric layer 23. This obtains the capacitor part 21, which is formed by sequentially depositing the first electrode 22, the dielectric layer 23, and the second electrode 24, on the insulating film 11 that covers both the first surface R1 of the substrate 10 and the wall surfaces of the through holes 10X. In other words, the resist pattern is formed to fabricate such a capacitor part 21, and patterning is performed using the resist pattern by dry etching.

The patterning of the metal layer 22A, the dielectric layer 23A, and the metal layer 24A can also be performed by wet etching.

Figure 4C:
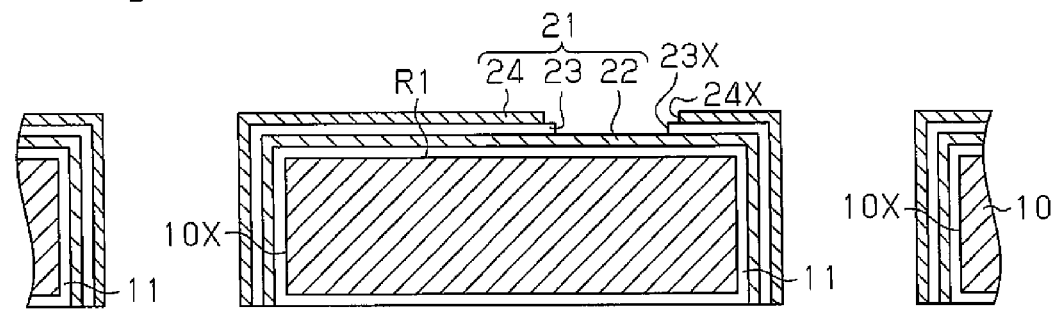

The structure illustrated in FIG. 4C is annealed under a high temperature. To promote crystallization of the dielectric layer 23, the annealing is performed in an oxygen atmosphere at 450° C. to 1000° C. for about 30 to 60 minutes. In this case, the upper limit temperature is determined in accordance with the heat-resistance temperatures of the first electrode 22 and the second electrode 24.

Figure 4D:
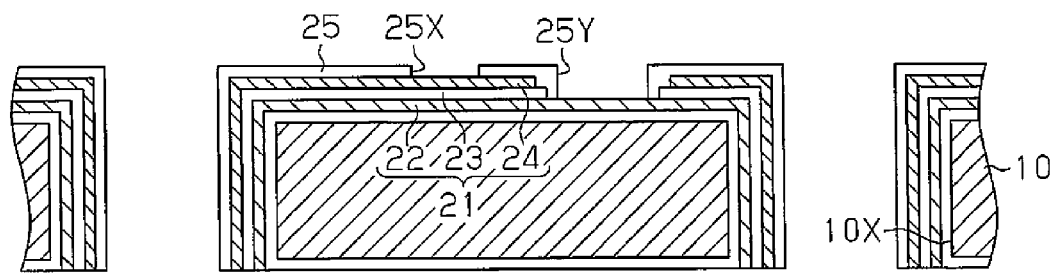

By forming an insulating layer (not illustrated) that becomes the first insulating layer 25 to cover the capacitor part 21, in the same manner as the dielectric layer 23A and the like, the insulating layer is patterned as illustrated in FIG. 4D by a series of processing including formation of the resist film, formation of the resist pattern, dry etching, and asking. The patterning forms the first insulating layer 25, which covers the capacitor part 21 and includes the opening 25X for exposing part of the upper surface of the second electrode 24 and the opening 25Y for exposing part of the upper surface of the first electrode 22. The insulating layer that becomes the first insulating layer 25 can be formed by sputtering, a sol-gel process, CVD, or the like and may also be patterned by, for example, wet etching.

Figure 5A:
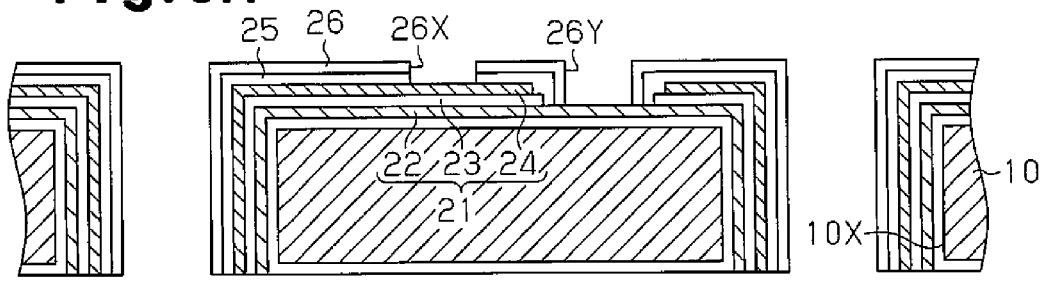

By forming an insulating layer that becomes the second insulating layer 26 to cover the capacitor part 21 and the first insulating layer 25, in the same manner as the dielectric layer 23A and the like, the insulating layer is patterned as illustrated in FIG. 5A by a series of processing including formation of the resist film, formation of the resist pattern, dry etching, and asking. The patterning forms the second insulating layer 26, which covers the capacitor part 21 and the second insulating layer 26 and includes the opening 26X for exposing part of the upper surface of the second electrode 24 and the opening 26Y for exposing part of the upper surface of the first electrode 22. The insulating layer that becomes the second insulating layer 26 can be formed by sputtering, a sol-gel process, CVD or the like, and may also be patterned by, for example, wet etching.

The penetration electrode 12 is formed in the through hole 10X sequentially covered by the insulating film 11, the first electrode 22, the dielectric layer 23, the second electrode 24, the first insulating layer 25, and the second insulating layer 26 (second step). The penetration electrode 12 can be formed, for example, by electrolytic plating or paste filling. Here, a method for forming the penetration electrode 12 by electrolytic plating will be described.

Figure 5B:
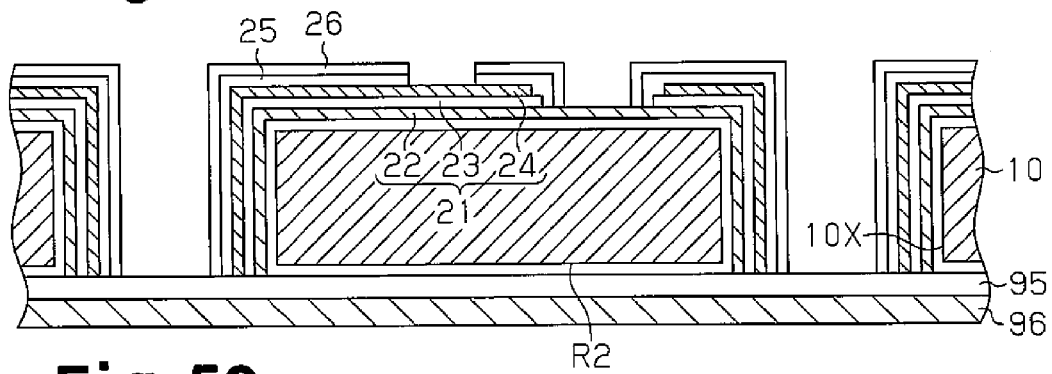
Figure 5C:
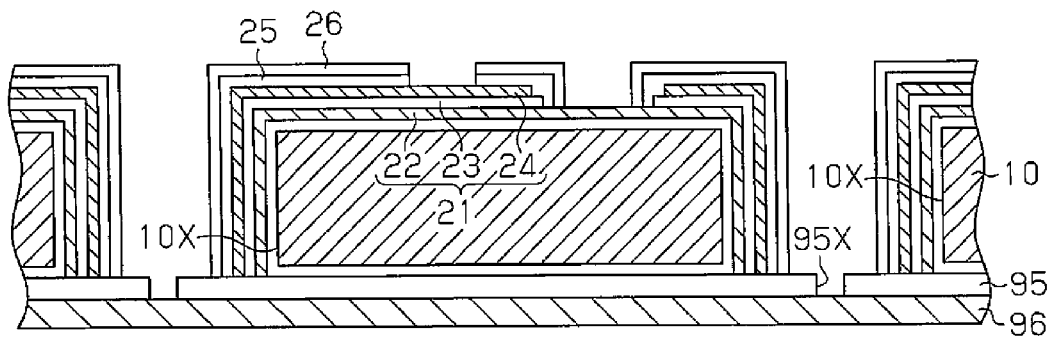

First, as illustrated in FIG. 5B, a metal foil 96 is adhered to an adhesive film 95 located in the second surface side of the substrate 10. As illustrated in FIG. 5C, an opening 95X for exposing the metal foil 96 is formed in a portion of the adhesive film 95 that is opposed to the through hole 10X. The opening 95X is formed by dry etching, for example.

Figure 5D:
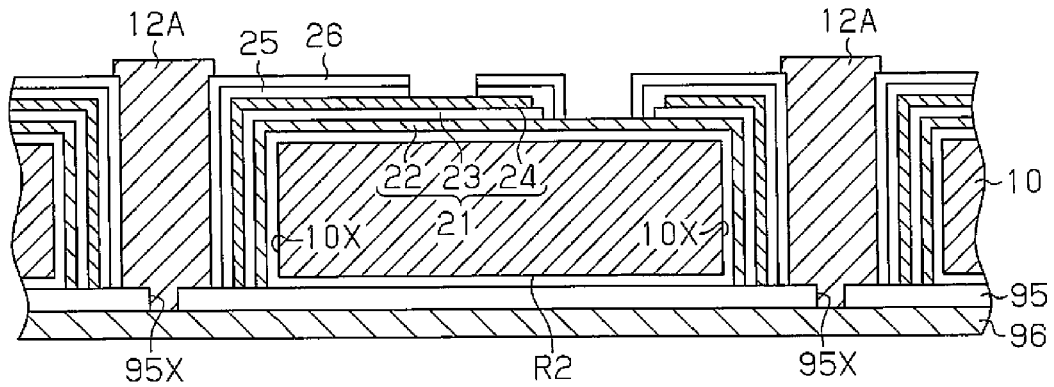

The structure illustrated in FIG. 5C is immersed in a plating solution and electrolytic plating is performed using the metal foil 96 as a power supplying layer. As illustrated in FIG. 5D, this forms a plating film 12A deposited and grown in the through hole 10X, which is covered by the insulating film 11, the first electrode 22, the dielectric layer 23, the second electrode 24, the first insulating layer 25, and the second insulating layer 26. As a result, the through hole 10X is filled with the plating film 12A. Then, the adhesive film 95 and the metal foil 96 are removed.

Figure 6A:
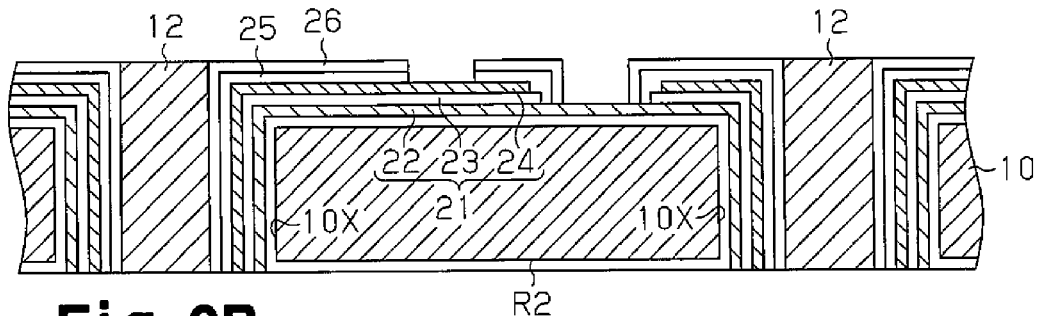

By removing the part of the plating film 12A, which protrudes from the upper surface of the second insulating layer 26, and polishing the plating film 12A, which protrudes from the lower surface of the insulating film 11 on the second surface R2 of the substrate 10, the penetration electrode 12 is formed as illustrated in FIG. 6A. As a result, the upper surface of the penetration electrode 12 becomes flat and flush with the upper surfaces of the second insulating layer 26. The lower surface of the penetration electrode 12 becomes flat and flush with the lower surface of the insulating film 11 on the second surface R2 of the substrate 10. Polishing includes chemical mechanical polishing (CMP), etching, or the like.

Figure 6B:
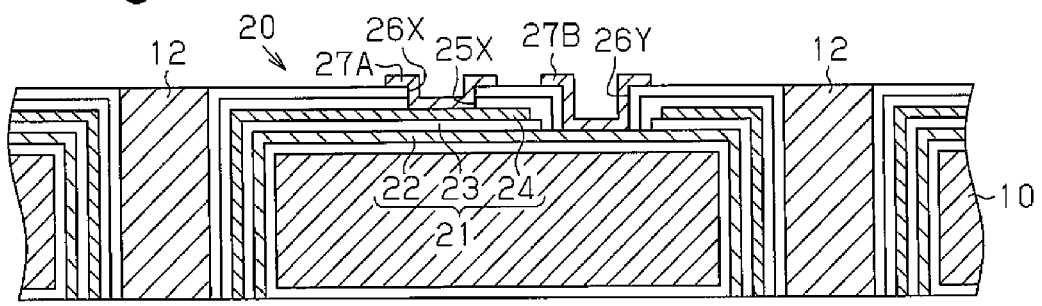

By forming a conductive layer that becomes the conductive layers 27A and 27B and is located in the first surface side to cover the entire surface of the first surface R1 of the substrate 10, in the same manner as the dielectric layer 23A and the like, the conductive layer is patterned as illustrated in FIG. 6B by a series of processing including formation of the resist film, formation of the resist pattern, dry etching, and asking. This patterning forms the first conductive layer 27A, which covers the upper surface of the second electrode 24 exposed from the openings 25X and 26X of the first and second insulating layers 25 and 26, and the second conductive layer 27B, which covers the upper surface of the first electrode 22 exposed from the openings 25Y and 26Y of the first and second insulating layers 25 and 26 (third step). The conductive layer that becomes the first and second conductive layers 27A and 27B can be formed by sputtering, MOCVD, or the like, and may also be patterned by, for example, wet etching.

Figure 6C:
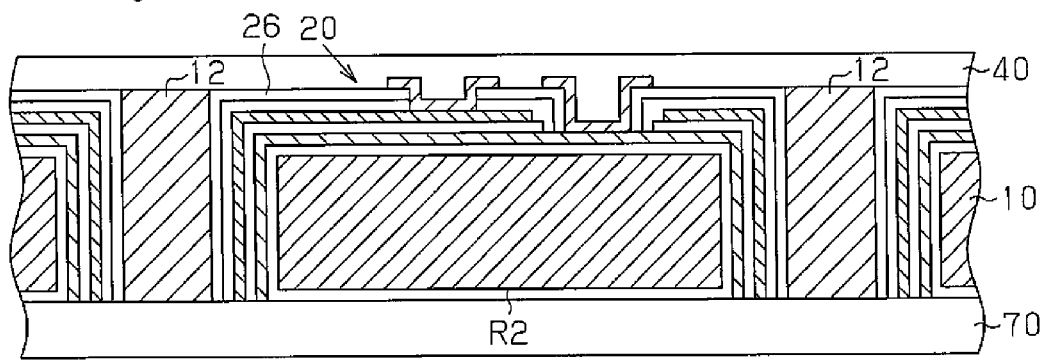

As illustrated in FIG. 6C, the insulating layer 40 is formed on the penetration electrodes 12 and the second insulating layer 26 to cover the penetration electrode 12 and the capacitor 20. As one example of a method for forming the insulating layer 40, a resin film formed from an epoxy-based resin or the like is formed in the first surface side to entirely cover the first surface R1 of the substrate 10. Then, the resin film is pressed. Subsequently, the resin film is heated to, for example, about 190° C. and then hardened. This forms the insulating layer 40. Alternatively, the insulating layer 40 can be formed in the first surface side by applying liquid resin, such as an epoxy-based resin, to entirely cover the first surface R1 of the substrate 10, heating the resin to, for example, about 190° C., and hardening the resin. The insulating layer 40 can also be formed by photolithography or screen printing.

The insulating layer 70 is formed on the insulating film 11 on the second surface R2 of the substrate 10 to cover the insulating film 11 and the penetration electrode 12. The insulating layer 70 can be formed in the same manner as the insulating layer 40.

Figure 6D:
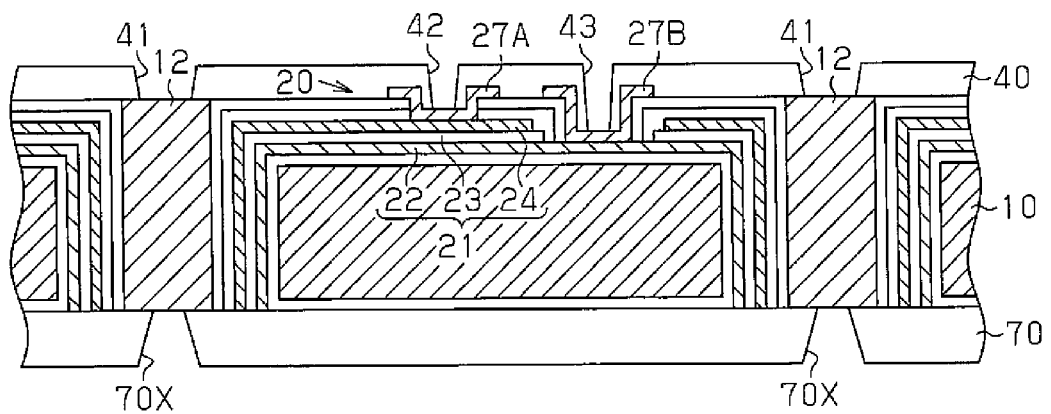

As illustrated in FIG. 6D, the via holes 41, 42, and 43 are formed at desired positions of the insulating layer 40 to respectively expose part of the upper surface of the penetration electrode 12, part of the first conductive layer 27A, and part of the second conductive layer 27B. The via holes 70X are formed at desired positions of the insulating layer 70 to expose part of the lower surface of each penetration electrode 12. These via holes 41, 42, 43, 70X can be formed by laser processing, such as carbon dioxide laser and excimer laser processing. When the insulating layers 40 and 70 are formed from a photosensitive resin, the desired via holes may be formed by photolithography, for example.

Figure 7A:
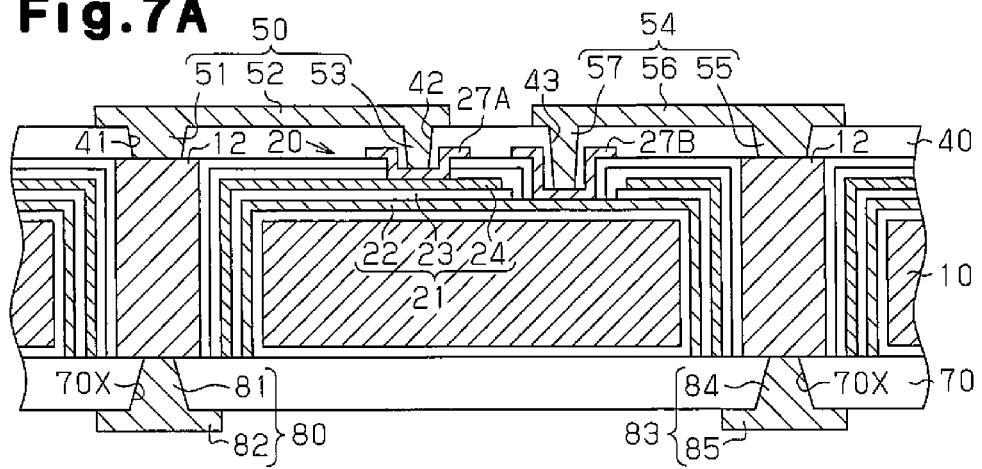

Next, as illustrated in FIG. 7A, the wiring layer 50, which includes the via 51, the wiring pattern 52, and the via 53, is formed. Further, the wiring layer 54, which includes the via 55, the wiring pattern 56, and the via 57, is formed. The wiring layers 50 and 54 can be formed through various wiring formation processes, such as a semi-additive process and a subtractive process.

The wiring layer 80, which includes the via 81 and the wiring pattern 82, and the wiring layer 83, which includes the via 84 and the wiring pattern 85, are formed. The wiring layers 80 and 83 can be formed in the same manner as the wiring layers 50 and 54.

Figure 7B:
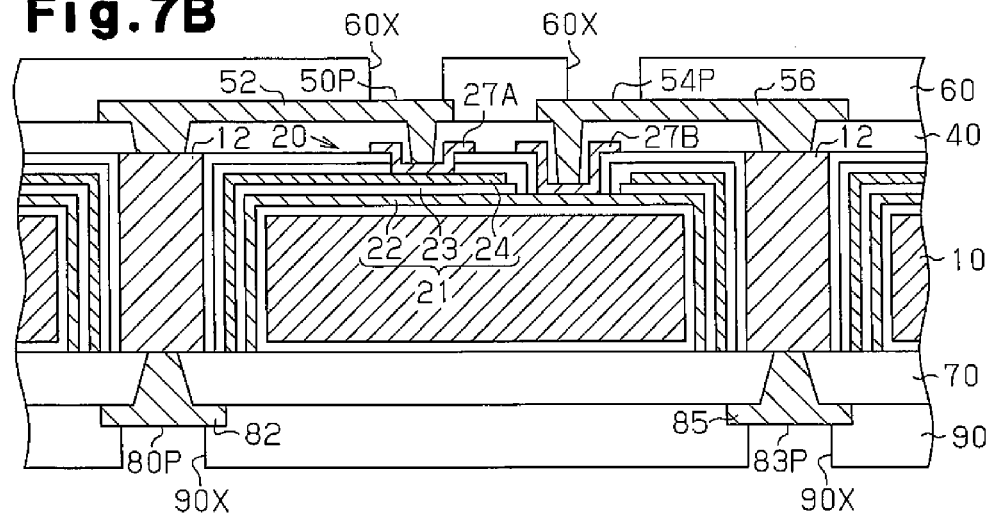

As illustrated in FIG. 7B, the solder resist layer 60, which includes the openings 60X for exposing parts of the wiring patterns 52 and 56, is formed on the insulating layer 40. The solder resist layer 90, which includes the openings 90X for exposing parts of the wiring patterns 82 and 85, is formed on the lower surface of the insulating layer 70.

For example, after forming the solder resist layer 60, which covers the wiring layers 50 and 54 and the insulating layer 40, the solder resist layer 60 is exposed and developed by photolithography to form the openings 60X, which expose parts of the wiring patterns 52 and 56. This step exposes part of the wiring layer 50 from the opening 60X of the solder resist layer 60 as the pad 50P and part of the wiring layer 54 from the opening 60X as the pad 54P. Further, part of the wiring layer 80 is exposed from the opening 90X of the solder resist layer 90 as the pad 80P, and part of the wiring layer 83 is exposed from the opening 90X as the pad 83P.

Figure 7C:
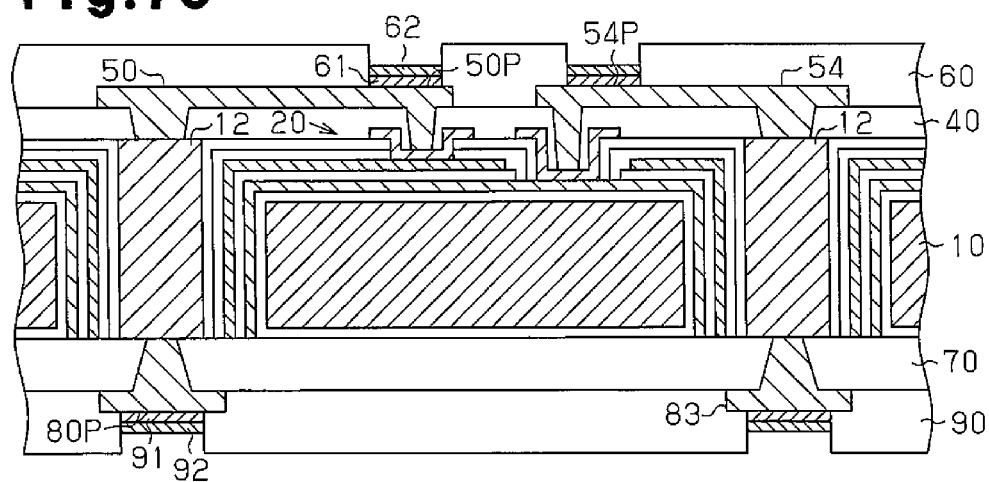

Then, as illustrated in FIG. 7C, the Ni-plated first surface plating layers 61 and 91 and the Au-plated second surface plating layers 62 and 92 are sequentially formed on the pads 50P, 54P, 80P and 83P. The surface plating layers can be formed by electroless plating, for example. In the first embodiment, a two-layered structure of the first surface plating layer and the second surface plating layer is formed. However, the present invention is not limited in such a manner, and the two-layered structure may be changed when necessary.

Figure 8A:
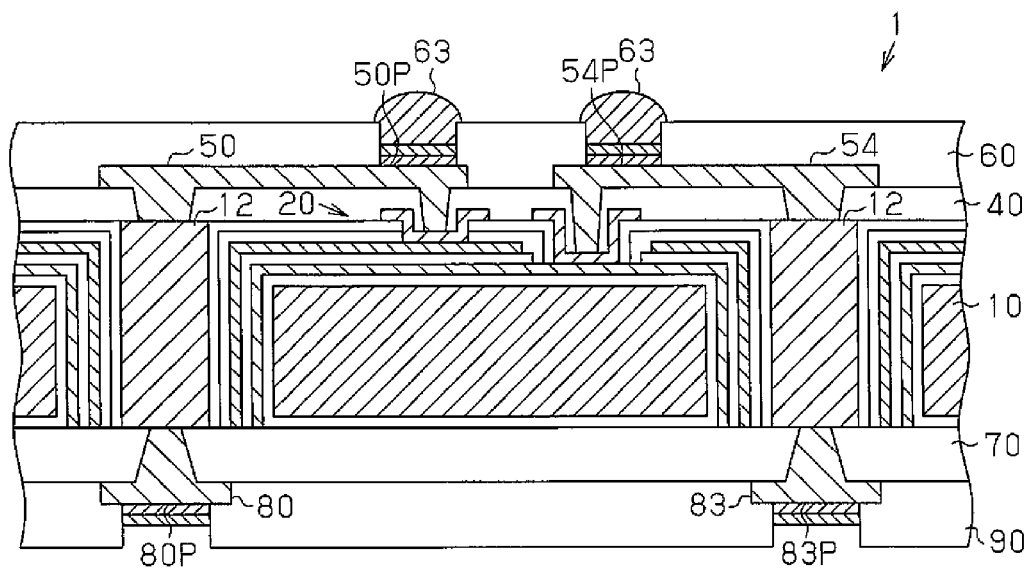

Next, as illustrated in FIG. 8A, a solder 63 is formed on each of the pads 50P and 54P. The solder 63 can be formed by applying a solder paste or mounting a solder ball. In this manner, the wiring board 1 of the first embodiment is manufactured.

A method for manufacturing the semiconductor device 2 using the wiring board 1 will now be described.

Figure 8B:
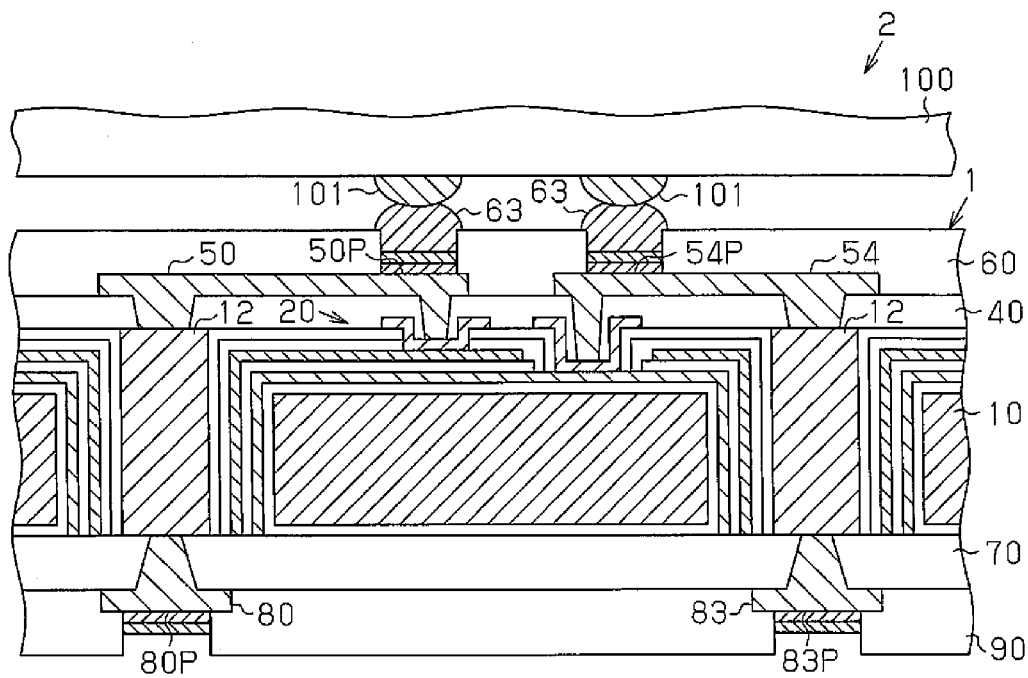
FIG. 8B is a schematic cross-sectional view illustrating the method for manufacturing the semiconductor device in the first embodiment.

First, as illustrated in FIG. 8B, the semiconductor element 100, in which the bumps 101 are formed on terminals, is positioned on the pads 50P and 54P. Then, the solders 63 and the bumps 101 are melted to electrically connect the semiconductor element 100 to the pads 50P and 54P (flip-chip bonding). Subsequently, when necessary, a liquid underfill resin (not illustrated) is filled and hardened between the semiconductor element 100 and the solder resist layer 60 of the wiring board 1. The above manufacturing steps manufacture the semiconductor device 2 of the first embodiment.

In the first embodiment, the manufacturing steps illustrated in FIGS. 3D to 5A are examples of a first step.

The first embodiment has the advantages described below.

(1) The capacitor 20 (capacitor part 21) is formed over the first surface R1 of the substrate 10 and the wall surfaces of the through holes 10X. This increase the area of the opposing surfaces of the first electrode 22 and the second electrode 24 sandwiching the dielectric layer 23 and increases the capacitance of the capacitor 20.

(2) Four types of insulating layers, which include the insulating film 11, the dielectric layer 23, the first insulating layer 25, and the second insulating layer 26, are formed between the penetration electrode 12 and the substrate 10 in the through hole 10X of the substrate 10. This improves the insulation reliability of the through holes 10X as compared to when only the insulating film 11 is present between the penetration electrode 12 and the substrate 10.

(3) The first electrode 22, the dielectric layer 23, and the second electrode 24, which form the capacitor part 21, are arranged between the penetration electrode 12 and the insulating film 11, which covers the wall surface of the through hole 10X. Thus, after forming the capacitor part 21 and annealing the capacitor part 21, the penetration electrode 12 can be formed in the through hole 10X.

(4) The penetration electrode 12 is formed after the high-temperature treatment (annealing) of the capacitor part 21. Thus, the penetration electrode 12 is not subjected to the high-temperature treatment in an oxygen atmosphere.

When the penetration electrode 12 is subjected to the high-temperature treatment in an oxygen atmosphere, the problems described below may also occur. When the penetration electrode 12 is subjected to the high-temperature treatment, metal (e.g., Cu) in the penetration electrode 12 is thermally diffused into the adjacent second insulating layer 26 and the like. This may lower the insulating reliability in the through holes 10X. Further, when the penetration electrode 12 is subjected to the high-temperature treatment, the volume of the penetration electrode 12 is expanded. Then, when returned to a room temperature, the penetration electrode 12 may become loose and fall out of the through hole 10X. Moreover, when the penetration electrode 12 is subjected to the high-temperature treatment in an oxygen atmosphere, the surface of the penetration electrode 12 is oxidized. This may lower the conductivity of the penetration electrode 12.

The manufacturing method of the first embodiment solves such problems since the penetration electrode 12 is not subjected to the high-temperature treatment.

Second Embodiment

A second embodiment will now be described with reference to FIGS. 9 and 10. In the second embodiment, a wiring board 3 and a semiconductor device 4 differ from those in the first embodiment in the multilayer structure on the wall surface of the through hole 10X in the wiring board 3. The description hereafter will focus on differences from the first embodiment.

Structure of Wiring Substrate in Second Embodiment

Figure 9:
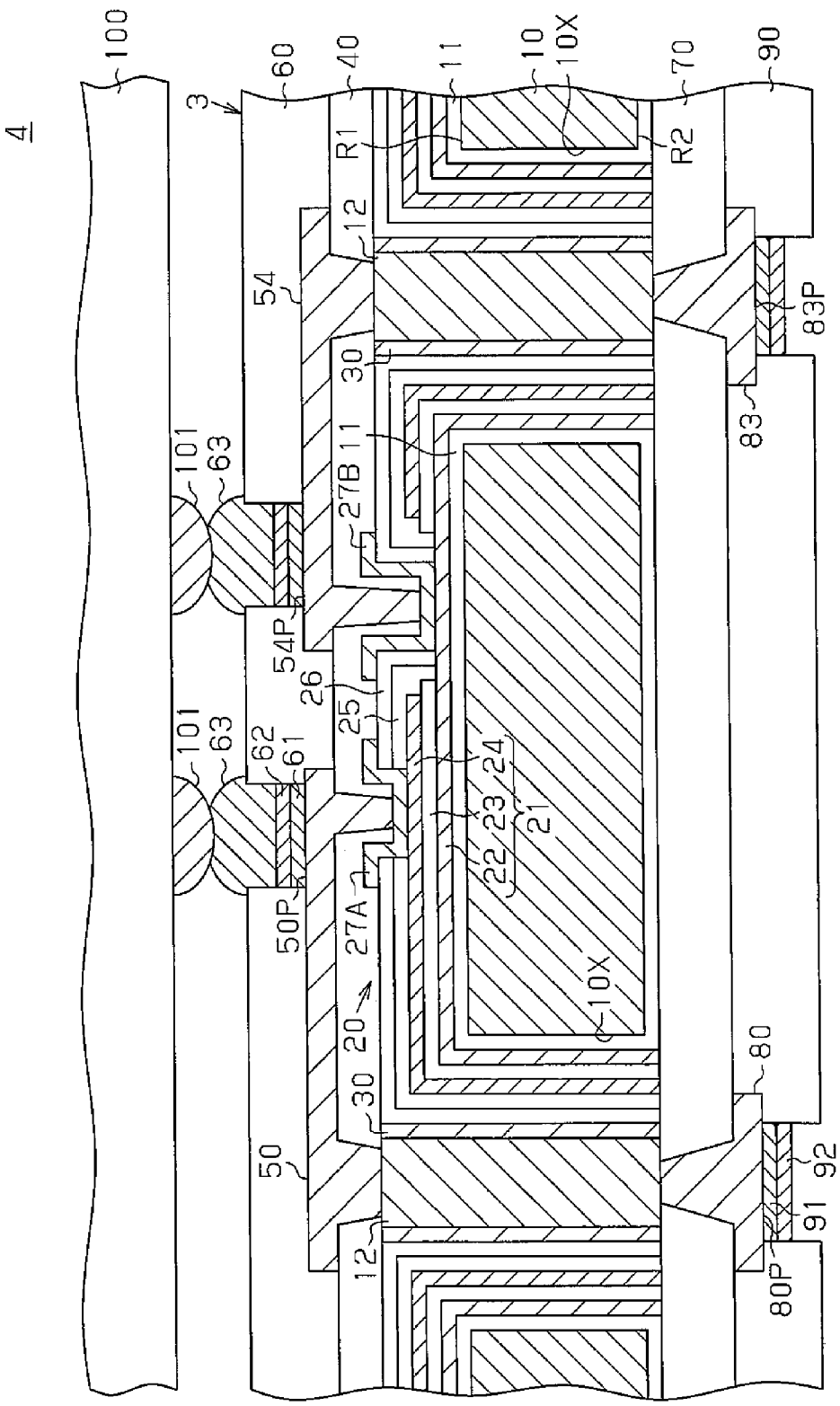
FIG. 9 is a schematic cross-sectional view illustrating part of a semiconductor device in a second embodiment.

As illustrated in FIG. 9, the first electrode 22, the dielectric layer 23, the second electrode 24, the first insulating layer 25, and the second insulating layer 26 are sequentially deposited on the surface of the insulating film 11 that covers the wall surface of each through hole 10X. A metal layer 30 is deposited on the surface of the second insulating layer 26. The metal layer 30 is in contact with the penetration electrode 12 and works to improve the adhesiveness between the penetration electrode 12 and the substrate 10. The metal layer 30 functions as a power supplying layer when forming the penetration electrode 12. To achieve such functions, for example, chromium (Cr), titanium (Ti), Ni, tantalum (Ta), and compounds of these substances can be used as the material for the metal layer 30. Preferably, the thickness of the metal layer 30 is 100 nm to 2000 nm and is 200 nm in the second embodiment.

The penetration electrode 12 is formed in the through hole 10X, which is sequentially covered by the insulating film 11, the first electrode 22, the dielectric layer 23, the second electrode 24, the first insulating layer 25, and the second insulating layer 26.

Method for Manufacturing Wiring Substrate in Second Embodiment

A method for manufacturing the wiring board 3 will now be described. The step for forming the penetration electrode 12 in the second embodiment differs from that in the first embodiment. Thus, only the step for forming the penetration electrode 12 will be described below.

Figure 10A:
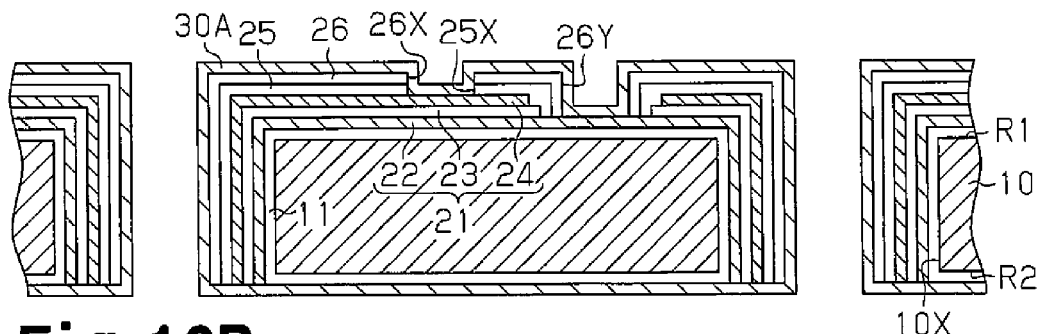
FIGS. 10A to 10D are schematic cross-sectional views illustrating a method for manufacturing a wiring board in the second embodiment.

As described above with reference to FIGS. 3 to 5A, the first electrode 22, the dielectric layer 23, the second electrode 24, the first insulating layer 25 and the second insulating layer 26 are sequentially formed on the insulating film 11 that covers the first surface R1 of the substrate 10 and the wall surfaces of the through holes 10X. As illustrated in FIG. 10A, the entire surface of the structure formed in this manner is covered by the metal layer 30A. Specifically, the metal layer 30A is formed to entirely cover the surfaces of the insulating film 11, first electrode 22, dielectric layer 23, second electrode 24, first insulating layer 25, and second insulating layer 26. This also covers the wall surface of the second insulating layer 26 with the metal layer 30A. The metal layer 30A can be formed by sputtering or CVD on the two surfaces (the first surface R1 and the second surface R2) of the substrate 10.

Figure 10B:
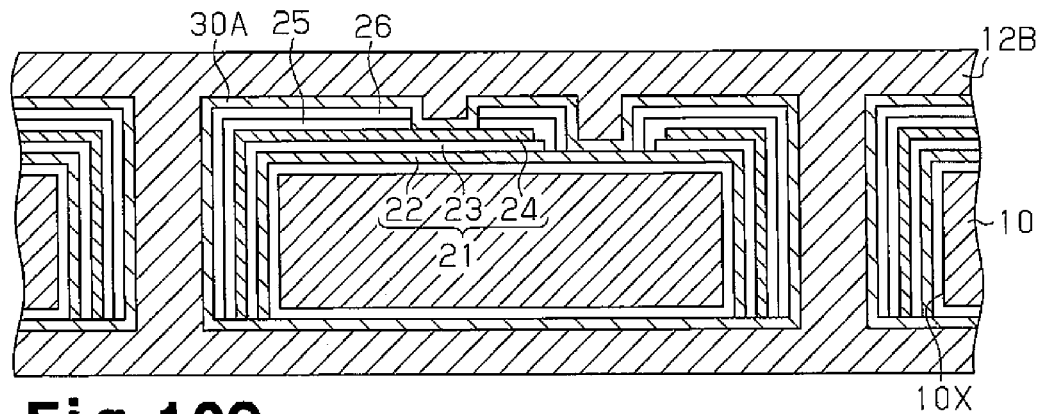

By immersing the structure illustrated in FIG. 10A in a plating solution and electrolytic plating using the metal layer 30A as a power supplying as illustrated in FIG. 10B, a plating film 12B is deposited and grown in at least in each through hole 10X. This fills the through hole 10X with the plating film 12B. Here, the plating film 12B is formed to entirely cover the structure illustrated in FIG. 10A.

Figure 10C:
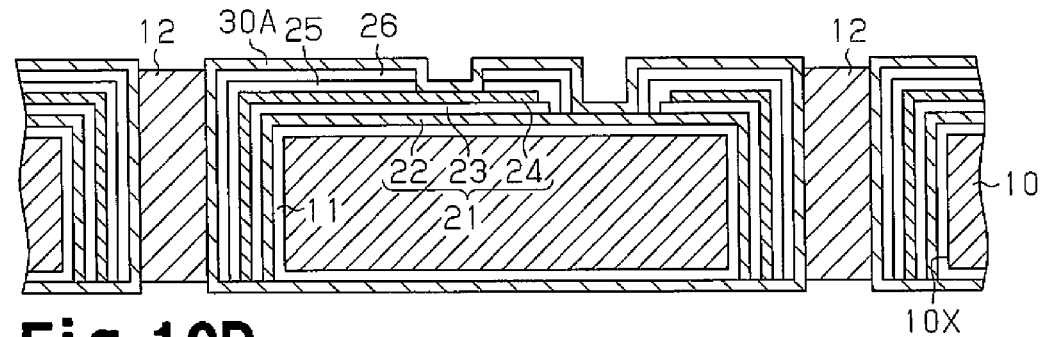

The plating film 12B protruding from the upper side of the second insulating layer 26 and the plating film 12B protruding from the lower side of the insulating film 11 on the second surface R2 of the substrate 10 are removed as illustrated in FIG. 10C to form the penetration electrode 12. The plating film 12B can be removed by CMP, etching, or the like. In this step, conditions such as the etching solution are set so that the plating film 12B is selectively removed from the metal layer 30A.

Figure 10D:
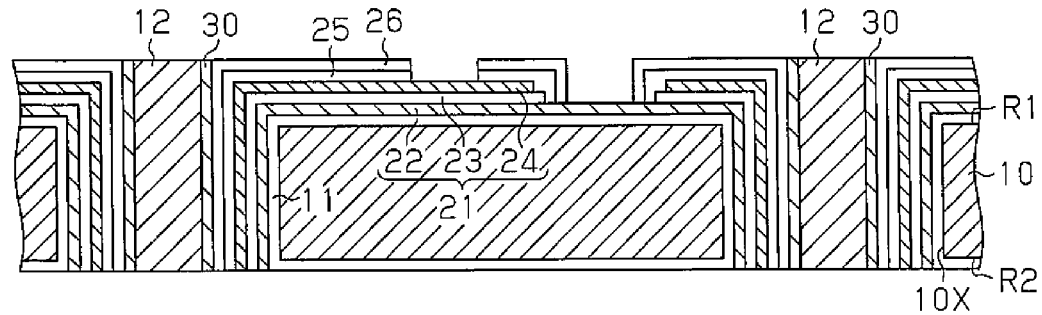

As illustrated in FIG. 10D, the metal layer 30A located in the first surface side and the second surface side is removed from the substrate 10. Thus, the metal layer 30A remains on only the surface of the second insulating layer 26 in each through hole 10X. This forms the metal layer 30 that covers the wall surface of the second insulating layer 26. The metal layer 30A can be removed by wet etching or dry etching. In this step, conditions such as the etching solution are set so that the metal layer 30A is selectively removed from the penetration electrode 12.

The above manufacturing steps form the penetration electrode 12 in each through hole 10X, which is sequentially covered by the insulating film 11, the first electrode 22, the dielectric layer 23, the second electrode 24, the first insulating layer 25, and the second insulating layer 26. The following manufacturing steps are substantially the same as the manufacturing steps illustrated in FIGS. 6B to 8 and thus will not be described.

In addition to advantages (1) to (4) of the second embodiment, the second embodiment has the following advantage.

(5) The metal layer 30 is formed in contact with the penetration electrode 12 and improves the adhesiveness between the penetration electrode 12 and the substrate 10 (specifically, the second insulating layer 26 deposited on the substrate 10). This prevents the penetration electrode 12 from becoming loose and falling out of the through hole 10X, which is sequentially covered by the insulating film 11, the first electrode 22, the dielectric layer 23, the second electrode 24, the first insulating layer 25, and the second insulating layer 26.

It should be apparent to those skilled in the art that the present invention may be embodied in many other specific forms without departing from the spirit or scope of the invention. Particularly, it should be understood that the present invention may be embodied in the following forms.

The structure of the capacitor 20 in each of the embodiments is not specifically limited as long as it includes at least the capacitor part 21, in which the first electrode 22, the dielectric layer 23, and the second electrode 24 are deposited, and the insulating layer covering the side wall of the second electrode 24.

First Modification of First Embodiment

Figure 11:
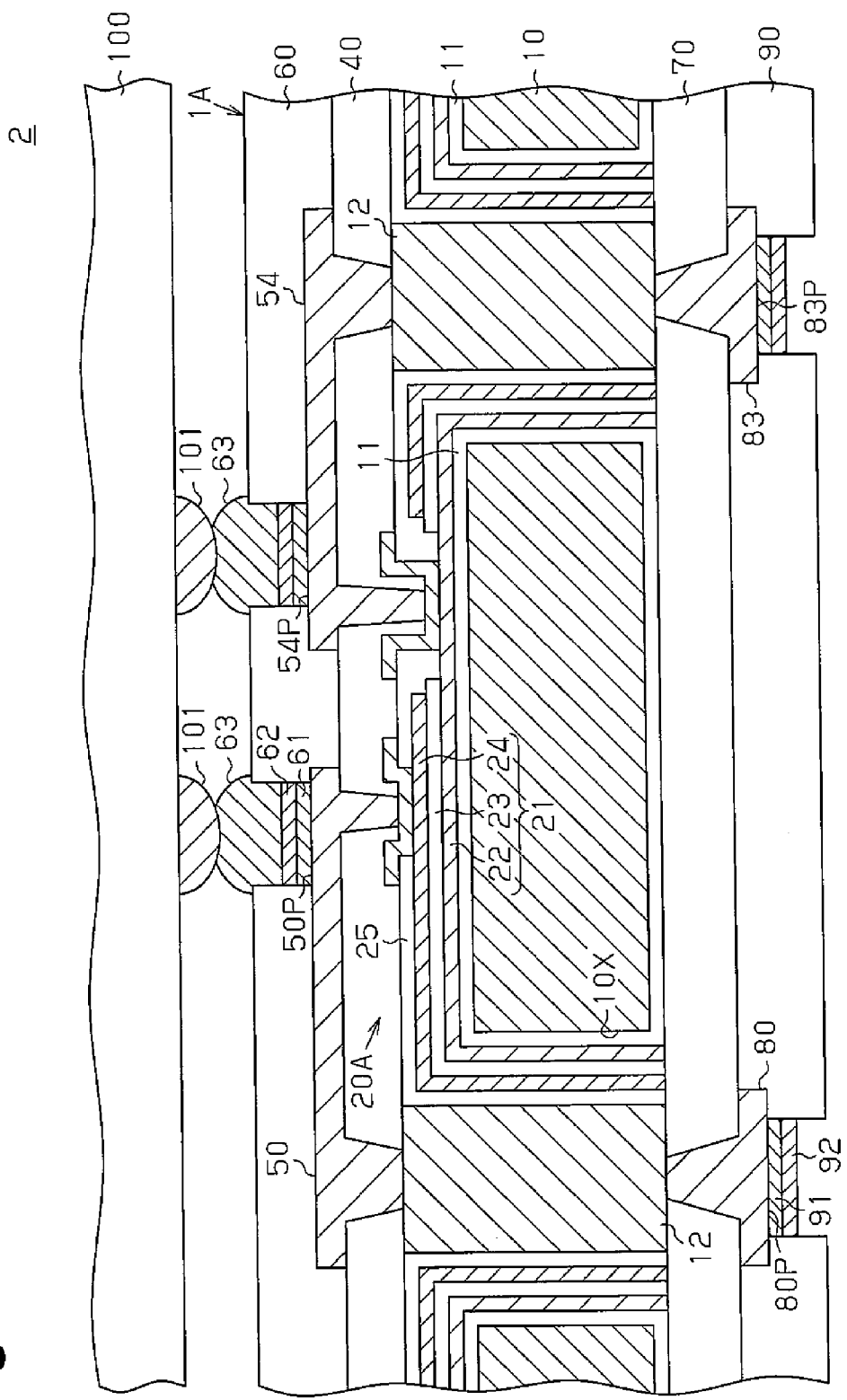
FIG. 11 is a schematic cross-sectional view illustrating part of a semiconductor device in a first modification of the first embodiment.

As illustrated in FIG. 11, for example, a wiring board 1A may include a capacitor 20A that omits the second insulating layer 26 from the capacitor 20.

Second Modification of First Embodiment

Figure 12:
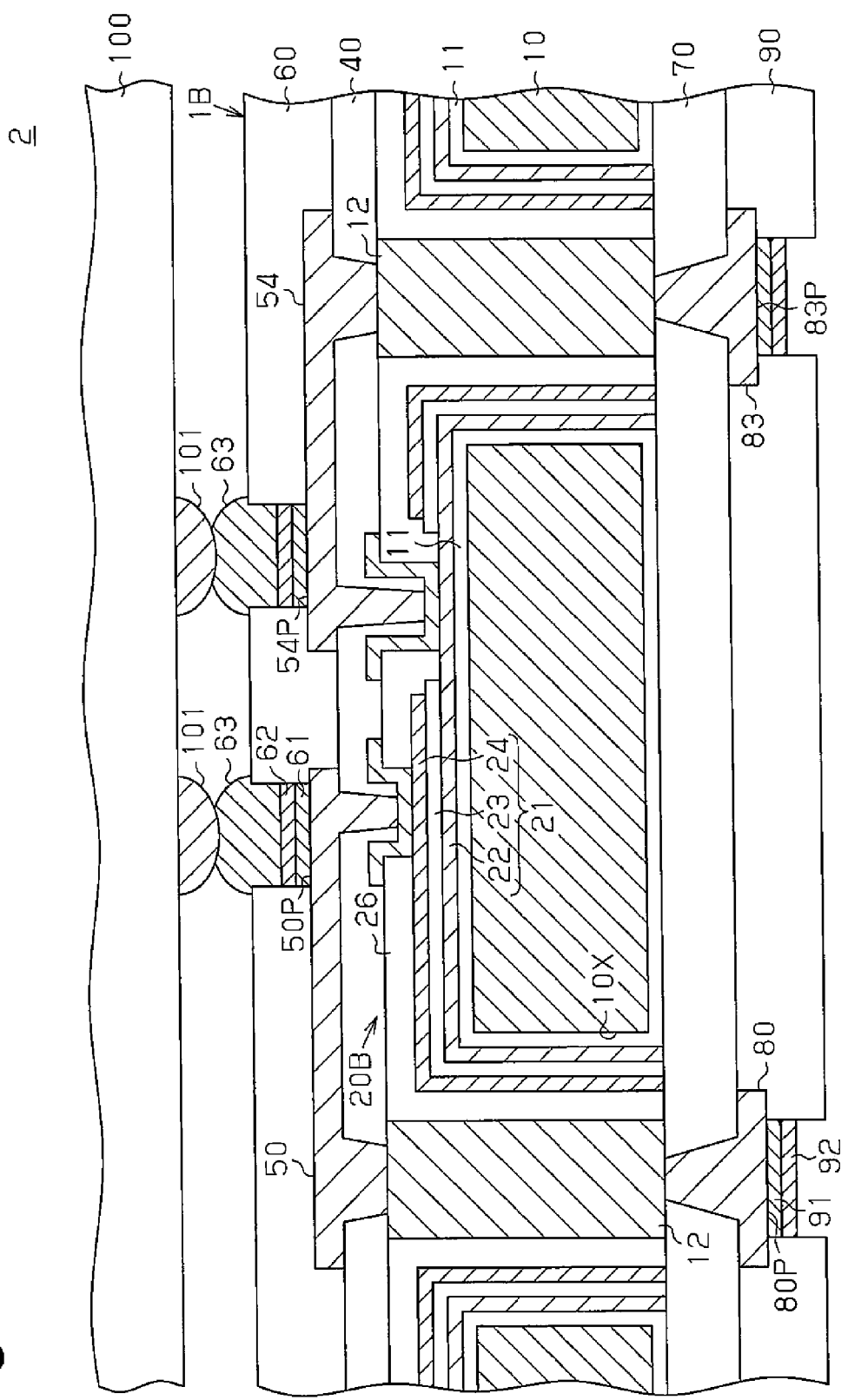
FIG. 12 is a schematic cross-sectional view illustrating part of a semiconductor device in a second modification of the first embodiment.

As illustrated in FIG. 12, for example, a wiring board 1B may include a capacitor 20B that omits the first insulating layer 25 from the capacitor 20.

In the same manner, in the second embodiment, either one of the first insulating layer 25 and the second insulating layer 26 may be omitted from the capacitor 20.

First Modification of Second Embodiment

Figure 13:
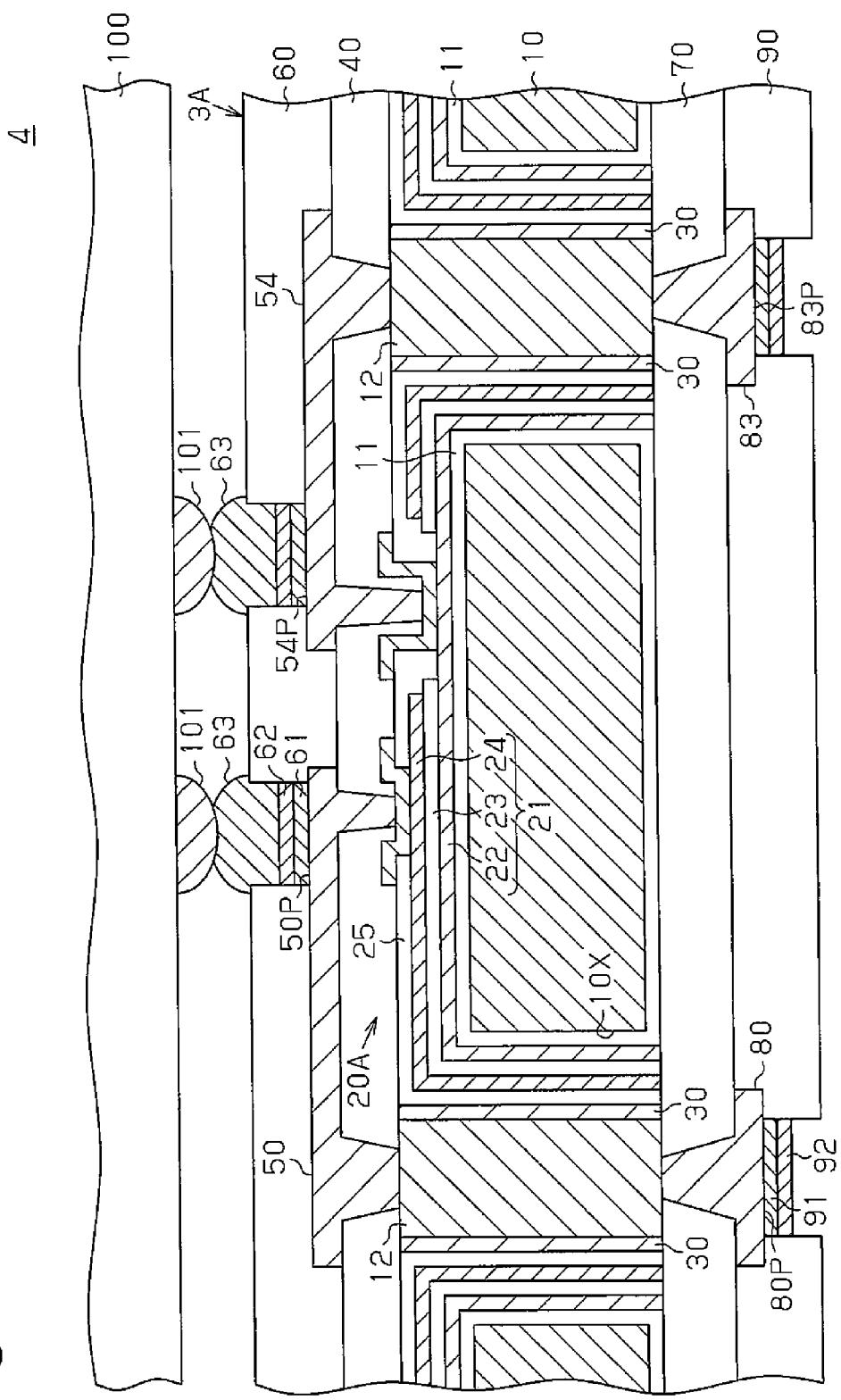
FIG. 13 is a schematic cross-sectional view illustrating part of a semiconductor device in a first modification of the second embodiment.

For example, in a wiring board 3A illustrated in FIG. 13, the capacitor 20A may be formed by omitting the second insulating layer 26 from the capacitor 20. Further, the metal layer 30 may be formed to cover the side wall of the first insulating layer 25 of the capacitor 20A.

Second Modification of Second Embodiment

Figure 14:
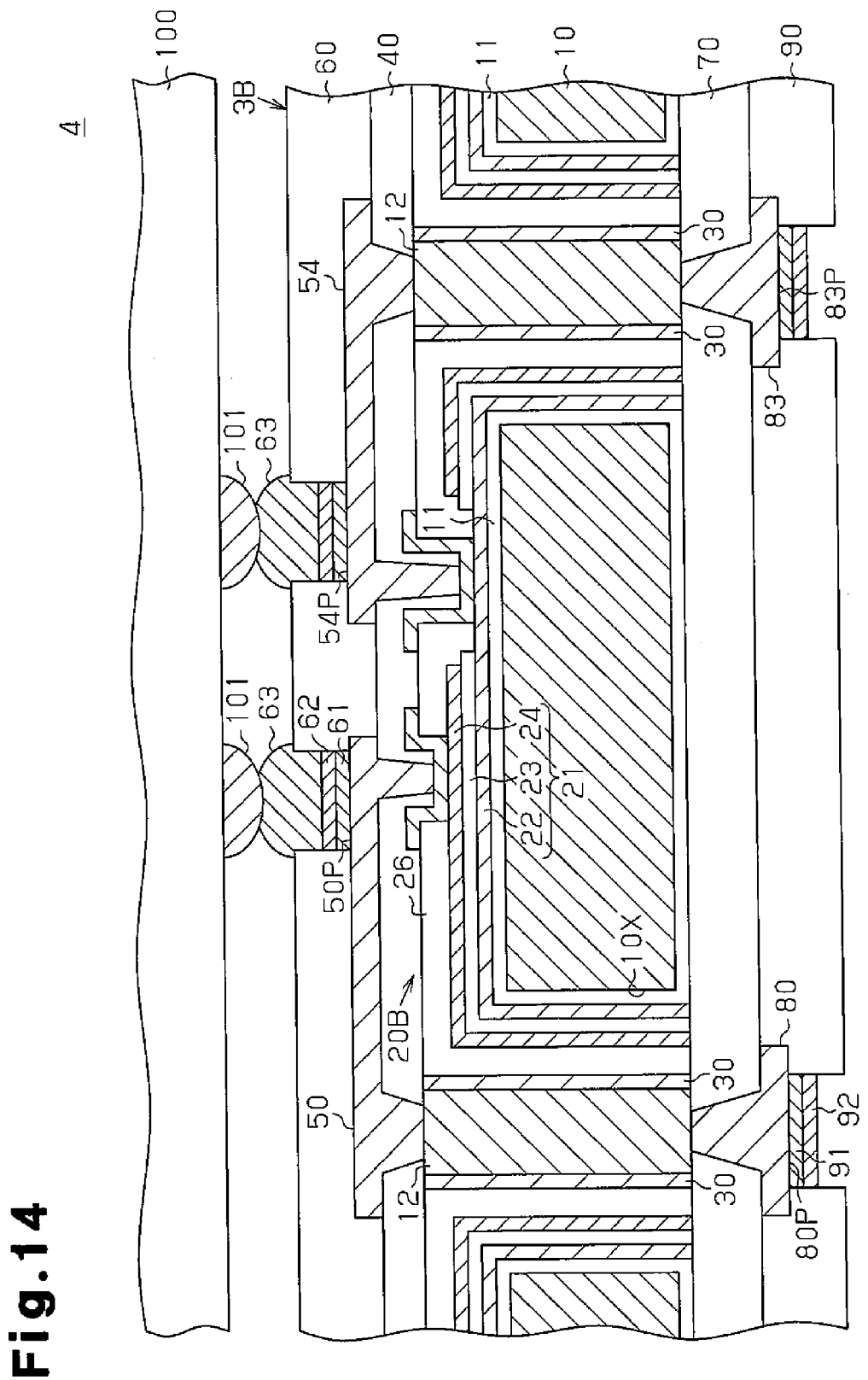
FIG. 14 is a schematic cross-sectional view illustrating part of a semiconductor device in a second modification of the second embodiment.
Figure 15A:
FIGS. 15A to 15G are schematic cross-sectional views illustrating a method for manufacturing a wiring board in the prior art.
Figure 15B:
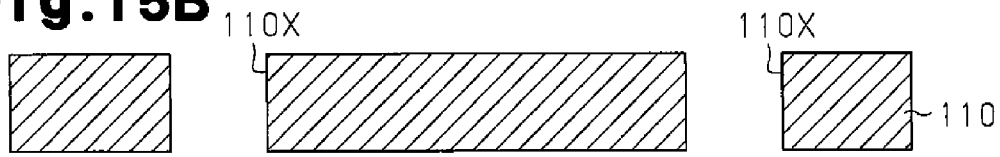
Figure 15C:
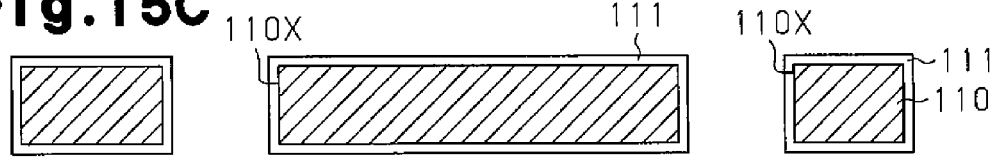
Figure 15D:
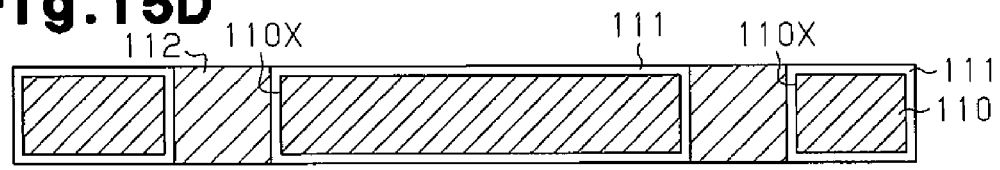
Figure 15E:
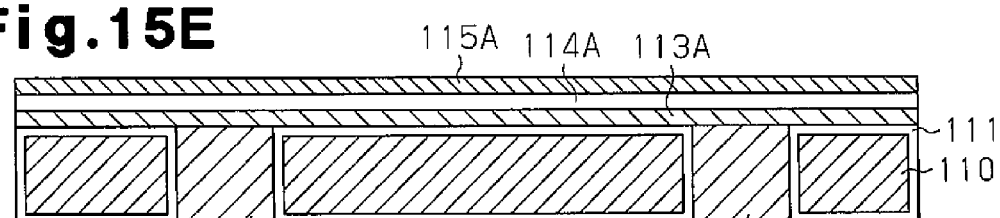
Figure 15F:
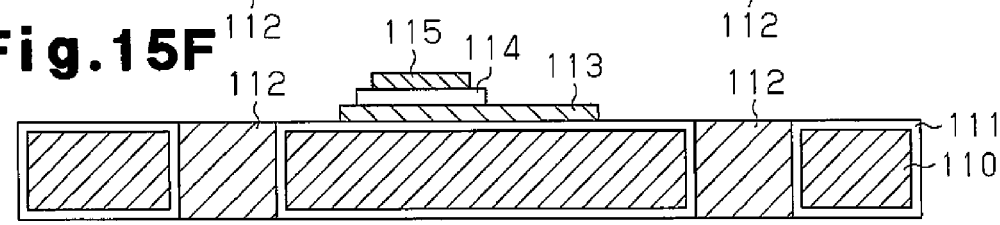
Figure 15G:
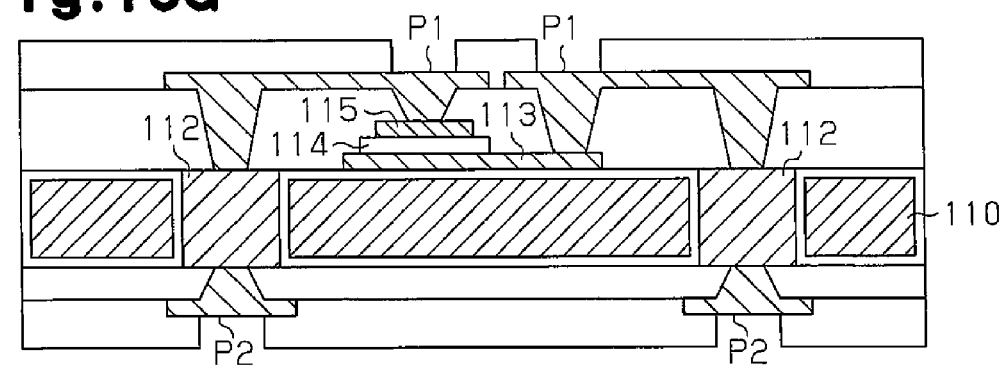

For example, in a wiring board 3B illustrated in FIG. 14, the capacitor 20B may be formed by omitting the first insulating layer 25 from the capacitor 20. Further, the metal layer 30 may be formed to cover the side wall of the second insulating layer 26.

In the above embodiments, the metal layer 22A becomes the first electrode 22, the dielectric layer 23A becomes the dielectric layer 23 and the metal layer 24A becomes the second electrode 24. Then, the metal layer 22A, the dielectric layer 23A, and the metal layer 24A are independently patterned. The present invention is not limited in such a manner. For example, the metal layer 22A may be formed on the insulating film 11 on the first surface R1 of the substrate 10, and the metal layer 22A may be patterned to form the first electrode 22. Then, the dielectric layer 23A may be formed on the first electrode 22. In the same manner, after the dielectric layer 23A, which includes the opening 23X, is patterned to form the dielectric layer 23. Afterward, the metal layer 24A that becomes the second electrode 24 may be formed. In this case, annealing of the dielectric layer 23 may be performed before the metal layer 24A is formed.

The number of the wiring layers formed on the substrate 10 and the number of insulating layers that cover the wiring layers is not specifically limited in the above embodiments.

For purposes of clarification and consistency between the description and the claims, it is noted that the first insulating layer 25 and second insulating layer 26, described above, respectively correspond to, and represent examples of, the third insulating layer and fourth insulating layer recited in the claims.

The present examples and embodiments are to be considered as illustrative and not restrictive, and the invention is not to be limited to the details given herein, but may be modified within the scope and equivalence of the appended claims.

The invention claimed is:

1. A wiring board comprising:
a silicon substrate including first and second through holes each communicating with a first surface and a second surface of the silicon substrate;
a capacitor formed on an insulating film, which is applied to the silicon substrate, on the first surface and wall surfaces of the first and second through holes, wherein a capacitor part of the capacitor includes a first electrode, a dielectric layer, and a second electrode that are sequentially deposited on the insulating film on the first surface and the wall surfaces of the first and second through holes;

first and second penetration electrodes formed in the first and second through holes covered by the insulating film, the first electrode, the dielectric layer, and the second electrode of the capacitor part;

a first insulating layer formed over the first surface of the silicon substrate to cover the capacitor;

a second insulating layer laminated on a lower surface of the insulating film, which covers the second surface of the silicon substrate;

a first wiring layer laminated on the first insulating layer and electrically connecting the first electrode to the first penetration electrode;

a second wiring layer laminated on the first insulating layer and electrically connecting the second electrode to the second penetration electrode;

a third wiring layer laminated on a lower surface of the second insulating layer and connected to a lower surface of the first penetration electrode; and a fourth wiring layer laminated on the lower surface of the second insulating layer and connected to a lower surface of the second penetration electrode;

wherein the lower surfaces of the first and second penetration electrodes and lower end surfaces of the first electrode, the dielectric layer, and the second electrode of the capacitor part that are exposed from the first and second through holes in the second surface of the silicon substrate are flush with the lower surface of the insulating film that covers the second surface of the silicon substrate.

2. The wiring board according to claim 1, wherein the capacitor includes a third insulating layer, which is formed on the capacitor part and includes an opening for exposing part of the first electrode and an opening for exposing part of the second electrode;

a first conductive layer covering the part of the first electrode exposed from the third insulating layer; and a second conductive layer covering the part of the second electrode exposed from the third insulating layer;

wherein the third insulating layer extends into the first and second through holes and includes a lower surface flush with the lower surfaces of the first and second penetration electrodes.

3. The wiring board according to claim 2, wherein the capacitor further includes a fourth insulating layer that entirely covers the third insulating layer to protect the capacitor part, wherein the first conductive layer covers the part of the first electrode and the part of the second electrode that are exposed from the third insulating layer and the fourth insulating layer, and wherein the fourth insulating layer extends into the first and second through holes and includes a lower surface flush with the lower surfaces of the first and second penetration electrodes.

4. The wiring board according to claim 1, wherein the wall surface of the first through hole is covered by a first metal layer that is in contact with at least the first penetration electrode;

the wall surface of the second through hole is covered by a second metal layer that is in contact with at least the second penetration electrode; and lower surfaces of the first and second metal layers are flush with the lower surfaces of the first and second penetration electrodes.

5. A semiconductor device comprising:
the wiring board according to claim 1; and
a semiconductor element mounted on the wiring board.

6. The wiring board according to claim 1, wherein the capacitor includes a fourth insulating layer that protects the capacitor part and includes an opening for exposing part of the first electrode and an opening for exposing part of the second electrode, a first conductive layer covering the part of the first electrode exposed from the fourth insulating layer, and a second conductive layer covering the part of the second electrode exposed from the fourth insulating layer, wherein the fourth insulating layer extends into the first and second through holes and includes a lower surface flush with the lower surfaces of the first and second penetration electrodes.

7. A method for manufacturing a wiring board, the method comprising:

preparing a silicon substrate including first and second through holes each communicating with a first surface and a second surface of the silicon substrate, and an insulating film, which covers the first and second surfaces and wall surfaces of the first and second through holes;

a first step of sequentially depositing a first electrode, a dielectric layer, and a second electrode on the insulating film on the first surface and the wall surfaces of the first and second through holes, to form a capacitor part;

a second step of forming first and second penetration electrodes respectively in the first and second through holes sequentially covered by at least the insulating film, the first electrode, the dielectric layer, and the second electrode, a third step of forming a first insulating layer over the first surface of the silicon substrate to cover the capacitor and forming a second insulating layer on a lower surface of the insulating film, which covers the second surface of the silicon substrate; and a fourth step of forming, on the first insulating layer, a first wiring layer, which electrically connects the first electrode to the first penetration electrode, and a second wiring layer, which electrically connects the second electrode to the second penetration electrode, and forming, on a lower surface of the second insulating layer, third and fourth wiring layers connected to lower surfaces of the first and second penetration electrodes, respectively;

wherein the lower surfaces of the first and second penetration electrodes and lower end surfaces of the first electrode, the dielectric layer, and the second electrode of the capacitor part that are exposed from the first and second through holes in the second surface of the silicon substrate are flush with the lower surface of the insulating film that covers the second surface of the silicon substrate.

8. The method according to claim 7, wherein the first step further includes forming a third insulating layer on the capacitor part, the third insulating layer including an opening for exposing part of the first electrode and an opening for exposing part of the second electrode, and forming a fourth insulating layer on the third insulating layer, and the method further comprises, after the second step and before the third step, a fifth step of forming a first conductive layer that covers the part of the first electrode exposed from the third insulating layer and forming a second conductive layer that covers the part of the second electrode exposed from the third insulating layer.

9. The method according to claim 7, wherein the second step includes
   forming a metal layer to entirely cover a structure obtained when the first step ends; and
   electrolytic plating using the metal layer as a power supplying layer to form the first and second penetration electrodes in the first and second through holes, respectively.

10. A wiring board comprising:
    a silicon substrate including first and second through holes each communicating with a first surface and a second surface of the silicon substrate;
    an insulating film that covers the first surface, the second surface and wall surfaces of the first and second through holes;
    a capacitor formed on the insulating film, wherein the capacitor includes a capacitor part extending continuously on the insulating film from the first surface and over the wall surface defining the first and second through holes;
    first and second penetration electrodes formed in the first and second through holes covered by the insulating film and the capacitor part;
    a first insulating layer formed over the first surface of the silicon substrate to cover the capacitor;
    a second insulating layer laminated on a lower surface of the insulating film, which covers the second surface of the silicon substrate;
    a first wiring layer laminated on the first insulating layer and electrically connecting a first electrode of the capacitor part to the first penetration electrode;
    a second wiring layer laminated on the first insulating layer and electrically connecting a second electrode of the capacitor part to the second penetration electrode;
    a third wiring layer laminated on a lower surface of the second insulating layer and connected to a lower surface of the first penetration electrode; and
    a fourth wiring layer laminated on the lower surface of the second insulating layer and connected to a lower surface of the second penetration electrode;
    wherein the capacitor part includes
      the first electrode extending continuously on the insulating film from the first surface and over the wall surfaces of the first and second through holes, the first electrode including end surfaces exposed from the first and second through holes;
      a dielectric layer extending continuously on the first electrode from the first surface and over the wall surfaces of the first and second through holes, the dielectric layer including end surfaces exposed from the first and second through holes; and
      the second electrode extending continuously on the dielectric layer from the first surface and over the wall surfaces of the first and second through holes, the second electrode including end surfaces exposed from the first and second through holes; and
    the lower surfaces of the first and second penetration electrodes, the lower end surface of the first electrode, the lower end surface of the dielectric layer, and the lower end surface of the second electrode that are exposed from the first and second through holes in the second surface of the silicon substrate are flush with the lower surface of the insulating film that covers the second surface of the silicon substrate.

11. The wiring board according to claim 10, wherein the dielectric layer is sandwiched between the first electrode and the second electrode, which are continuously formed from the wall surface of the first through hole to the wall surface of the second through hole.

12. The wiring board according to claim 10, wherein the first electrode, the dielectric layer and the second electrode that form the capacitor part include:
    a first capacitance formation region corresponding to and parallel to the first surface;
    a second capacitance formation region corresponding to the wall surface of the first through hole, extending continuously from the first capacitance formation region, and substantially orthogonal to the first surface; and
    a third capacitance formation region corresponding to the wall surface of the second through hole, extending continuously from the first capacitance formation region, and substantially orthogonal to the first surface;
    wherein the second and third capacitance formation regions include lower end surfaces flush with the lower surfaces of the first and second penetration electrodes.

* * * * *